US009237676B2

United States Patent
Gohara et al.

(10) Patent No.: US 9,237,676 B2
(45) Date of Patent: Jan. 12, 2016

(54) SEMICONDUCTOR MODULE COOLER AND SEMICONDUCTOR MODULE

(75) Inventors: Hiromichi Gohara, Matsumoto (JP); Akira Morozumi, Okaya (JP); Takeshi Ichimura, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 14/110,856

(22) PCT Filed: Apr. 16, 2012

(86) PCT No.: PCT/JP2012/060215
§ 371 (c)(1),
(2), (4) Date: Oct. 22, 2013

(87) PCT Pub. No.: WO2012/147544
PCT Pub. Date: Nov. 1, 2012

(65) Prior Publication Data
US 2014/0043765 A1 Feb. 13, 2014

(30) Foreign Application Priority Data
Apr. 26, 2011 (JP) .................................. 2011-098700

(51) Int. Cl.
*H05K 7/20* (2006.01)
*H01L 23/373* (2006.01)
*H01L 23/473* (2006.01)

(52) U.S. Cl.
CPC ........ *H05K 7/20254* (2013.01); *H01L 23/3735* (2013.01); *H01L 23/473* (2013.01);
(Continued)

(58) Field of Classification Search
CPC ........... H05K 7/20236; H05K 7/20254; H01L 23/473

USPC ........................ 257/715; 165/104.33; 361/699
See application file for complete search history.

(56) References Cited

U.S. PATENT DOCUMENTS 5,978,220 A * 11/1999 Frey et al. ..................... 361/699
2006/0225867 A1 * 10/2006 Park et al. ..................... 165/80.4
(Continued)

FOREIGN PATENT DOCUMENTS

JP 2001-035981 A 2/2001
JP 2006-080211 A 3/2006
(Continued)

OTHER PUBLICATIONS

Japan Patent Office, "Office Action for JP 2013-512011," Sep. 30, 2014.

*Primary Examiner* — Karen Kusumakar
*Assistant Examiner* — Adam S Bowen
(74) *Attorney, Agent, or Firm* — Manabu Kanesaka

(57) ABSTRACT

A semiconductor module cooler supplies a coolant to a water jacket from outside and cools a semiconductor device arranged on an outer surface of the cooler. The semiconductor module cooler has a heat sink thermally connected to the semiconductor device; a first flow channel arranged inside the water jacket with a guide section extending from a coolant inlet and having an inclined surface for guiding the coolant toward one side surface of the heat sink; a second flow channel arranged inside the water jacket in parallel to the first flow channel and extending to a coolant outlet; and a third flow channel formed inside the water jacket at a position connecting the first flow channel and the second flow channel. The coolant inlet and the coolant outlet are formed on a same wall surface of the water jacket, and the heat sink is arranged in the third flow channel.

15 Claims, 22 Drawing Sheets

(52) U.S. Cl.
CPC .. *H05K7/20927* (2013.01); *H01L 2224/32225* (2013.01); *H01L 2924/1305* (2013.01); *H01L 2924/13055* (2013.01)

(56) References Cited

U.S. PATENT DOCUMENTS

| | | | |
|---|---|---|---|
| 2007/0012423 | A1 | 1/2007 | Kinoshita et al. |
| 2008/0237847 | A1 | 10/2008 | Nakanishi et al. |
| 2009/0065178 | A1 | 3/2009 | Kasezawa et al. |
| 2009/0178792 | A1 | 7/2009 | Mori et al. |
| 2010/0051234 | A1 | 3/2010 | Mori et al. |
| 2010/0172091 | A1* | 7/2010 | Nishiura ............ 361/689 |
| 2010/0252235 | A1 | 10/2010 | Mori et al. |

FOREIGN PATENT DOCUMENTS

| | | | |
|---|---|---|---|
| JP | 2006-210819 | A | 8/2006 |
| JP | 2006-324647 | A | 11/2006 |
| JP | 2007-012722 | A | 1/2007 |
| JP | 2007-250701 | A | 9/2007 |
| JP | 2008-205371 | A | 9/2008 |
| JP | 2009-147107 | A | 7/2009 |
| JP | 2010-203694 | A | 9/2010 |

* cited by examiner

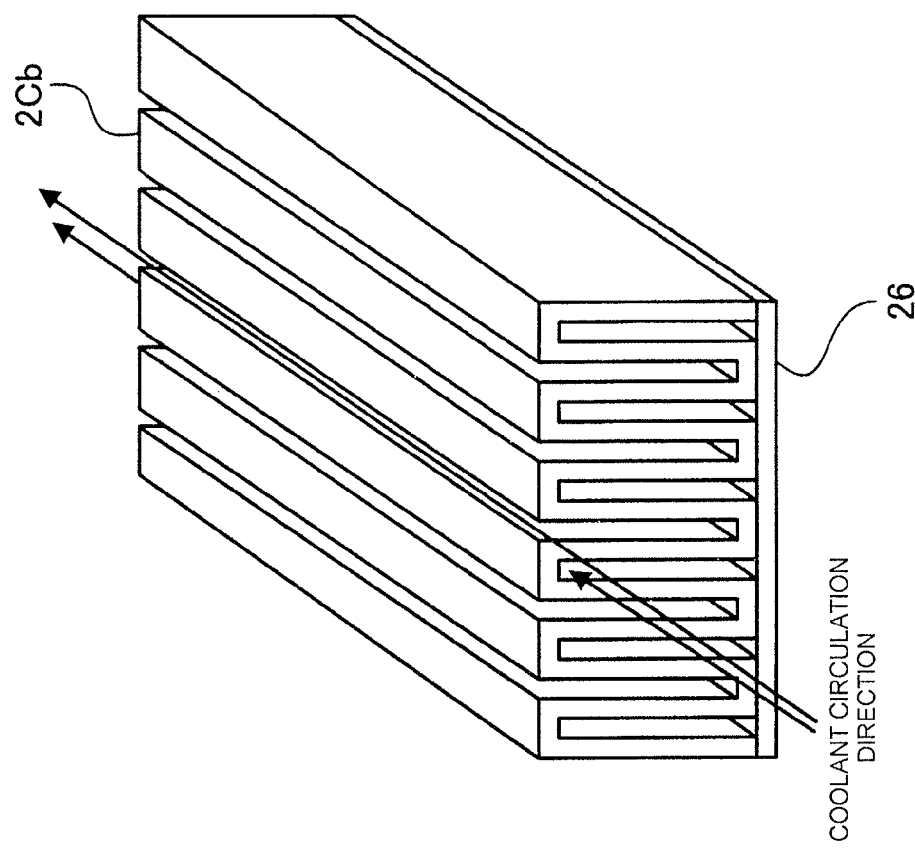
Fig. 4(a) BLADE FIN
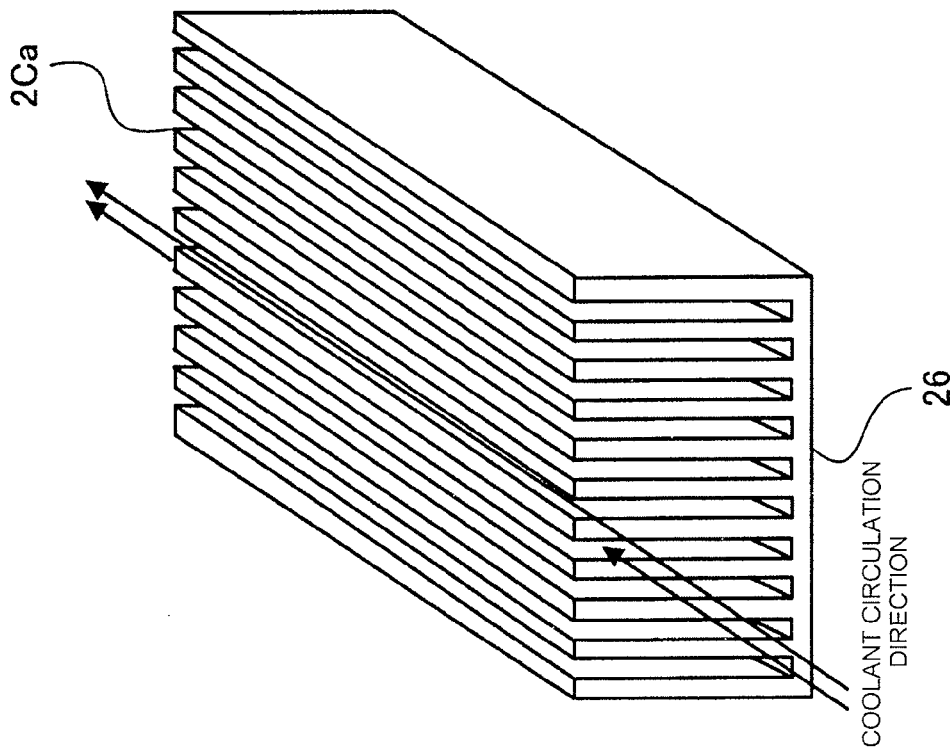
Fig. 4(b) CORRUGATED FIN

ARRANGEMENT EXAMPLE OF CIRCUIT ELEMENTS

SHAPE OF WATER JACKET (TYPE A)

SHAPE OF WATER JACKET (TYPE B)

SHAPE OF WATER JACKET (TYPE C)

Fig. 9(a) FLOW CHANNEL SHAPE (TYPE D)
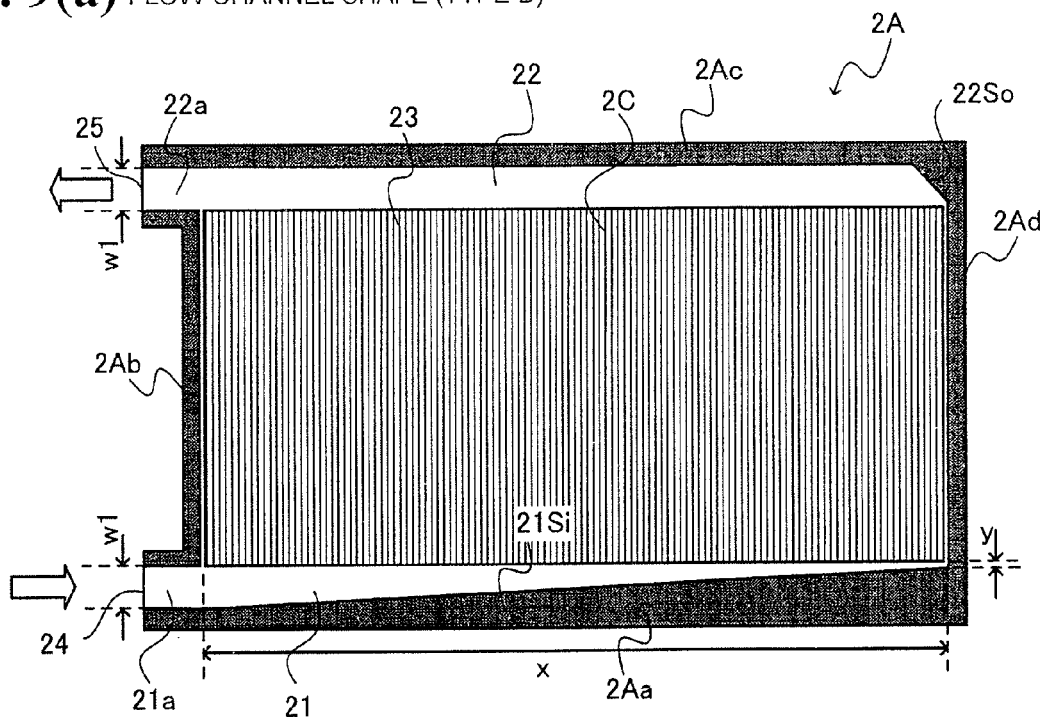
Fig. 9(b) FLOW CHANNEL SHAPE (TYPE G)
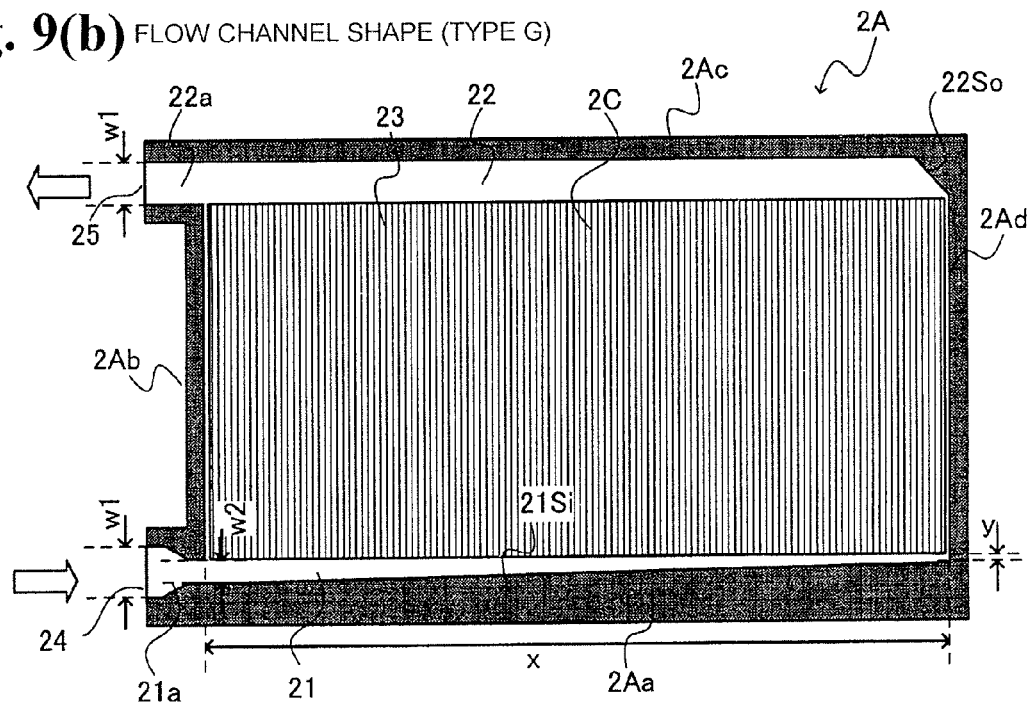

Fig. 10

FLOW CHANNEL SHAPE FOR EACH TYPE

| SHAPE OF COOLANT FLOW CHANNEL | GUIDE SECTION SHAPE | | FLOW CHANNEL WIDTH | |
|---|---|---|---|---|
| | x[mm] | y[mm] | w1[mm] | w2[mm] |
| TYPE D | 255 | 2 | 15 | — |
| TYPE E | 255 | 2 | 15 | 10 |
| TYPE Ea | 130 | 2 | 15 | 10 |
| TYPE Eb | 8 | 2 | 15 | 10 |
| TYPE F | 255 | 2 | 15 | 8 |
| TYPE G | 255 | 2 | 15 | 5 |
| TYPE Ga | 130 | 2 | 15 | 5 |
| TYPE Gb | 3 | 2 | 15 | 5 |

In-Out PRESSURE DIFFERENCE

FLOW CHANNEL SHAPE (TYPE H)

Fig. 15(a) FLOW CHANNEL SHAPE (TYPE I)
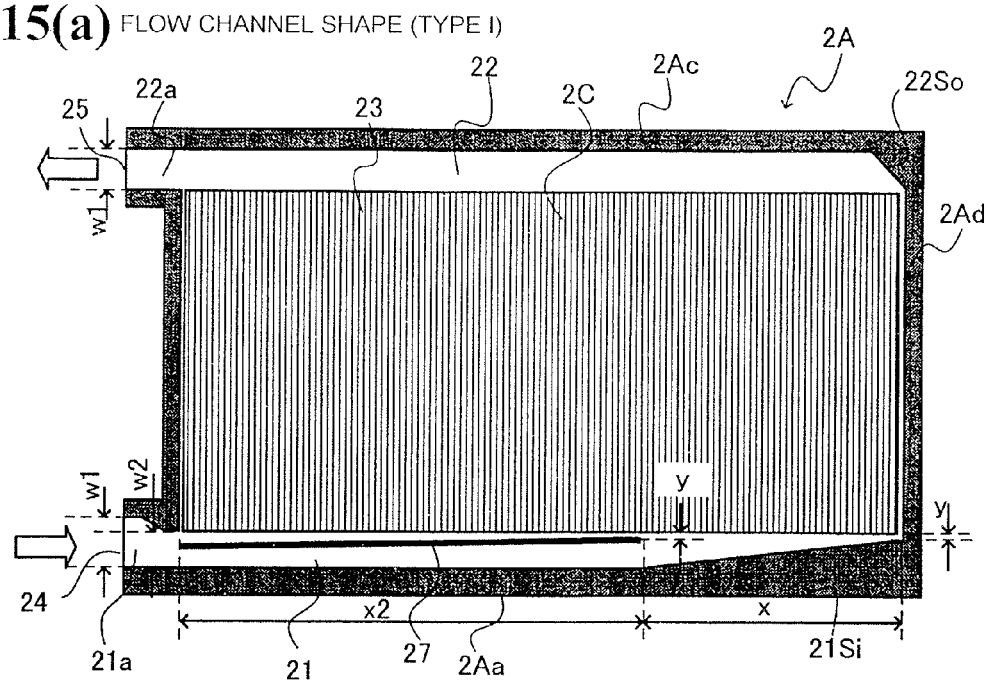
Fig. 15(b) FLOW CHANNEL SHAPE (TYPE K)
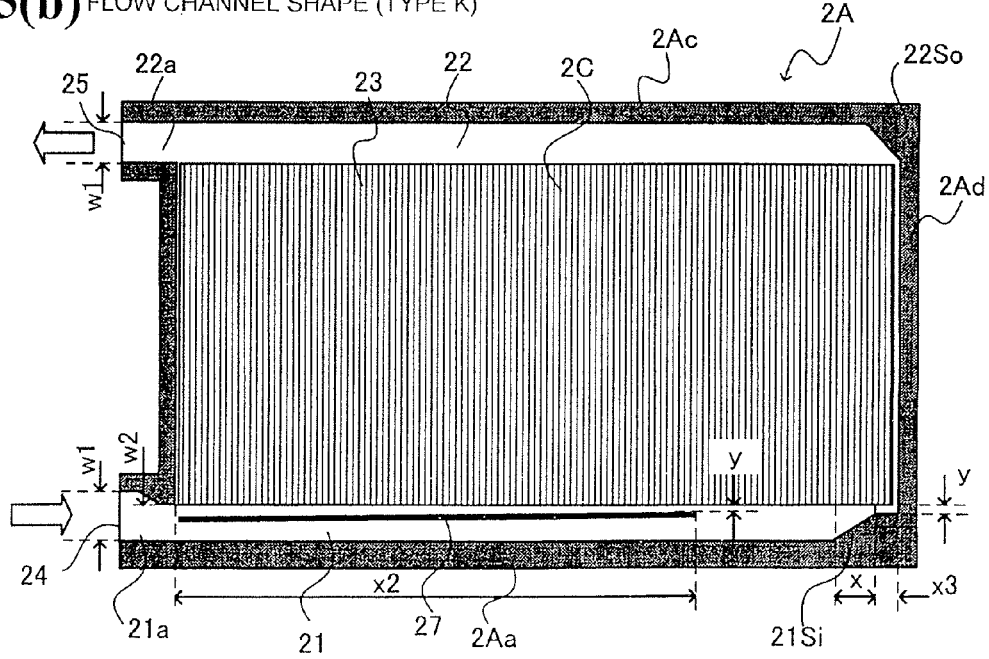

Fig. 16

FLOW CHANNEL DIMENSIONS FOR EACH TYPE

| SHAPE OF COOLANT FLOW CHANNEL | GUIDE SECTION SHAPE | | | | FLOW CHANNEL WIDTH | | | |
|---|---|---|---|---|---|---|---|---|
| | x[mm] | x2[mm] | x3[mm] | y[mm] | w1[mm] | w2[mm] | w3[mm] | w4[mm] |
| TYPE H | 127.5 | 127.5 | — | 2 | 15 | 10 | 3.5 | 5 |
| TYPE I | 85 | 170 | — | 2 | 15 | 10 | 3.5 | 5 |
| TYPE J | 40 | 215 | — | 2 | 15 | 10 | 3.5 | 5 |
| TYPE K | 13 | 215 | 5 | 2 | 15 | 10 | 3.5 | 5 |
| TYPE L | 8 | 215 | 5 | 2 | 15 | 10 | 3.5 | 5 |

FLOW VELOCITY DISTRIBUTION

In-Out PRESSURE DIFFERENCE

IGBT ON DOWNSTREAM SIDE OF 3D

IGBT ON DOWNSTREAM SIDE OF 3G

IGBT ON DOWNSTREAM SIDE OF 3Id

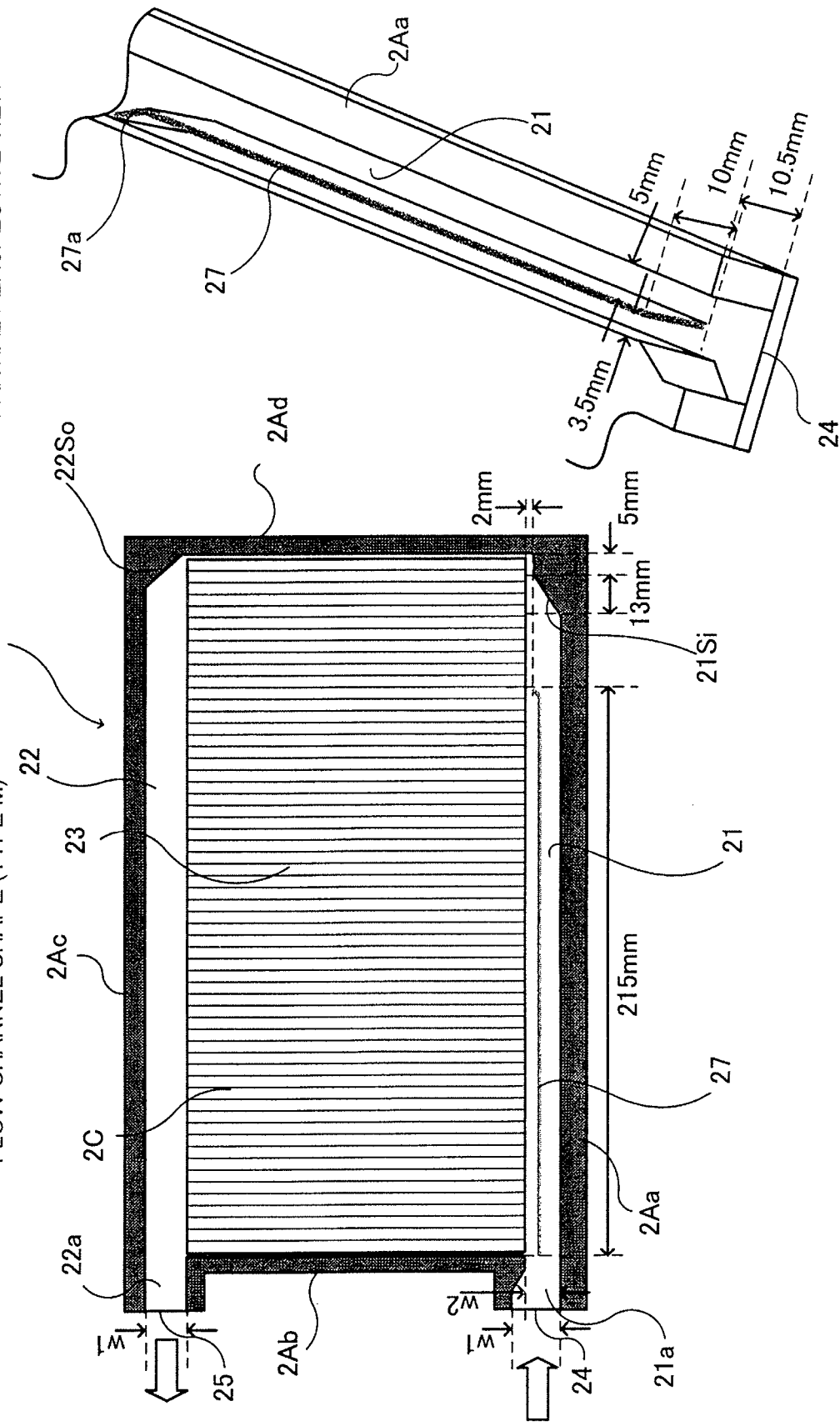

GUIDE SECTION SHAPE (TYPE N)

FLOW VELOCITY DISTRIBUTION

In-Out PRESSURE DIFFERENCE

Fig. 22(a) IGBT ON DOWNSTREAM SIDE OF 3D
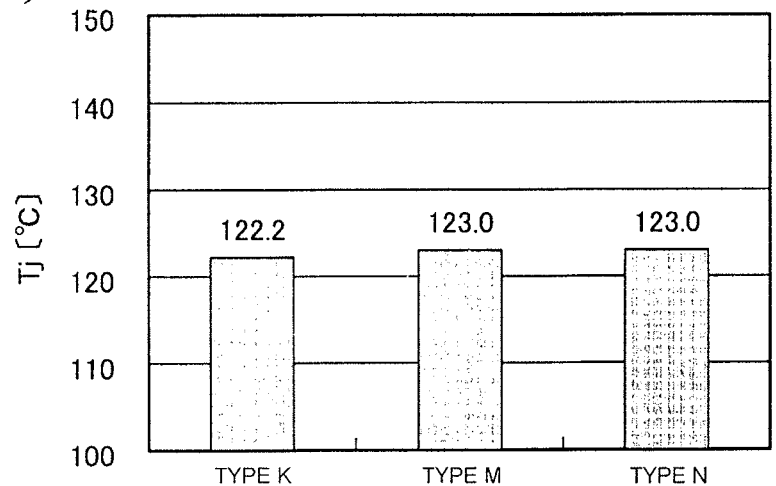
Fig. 22(b) IGBT ON DOWNSTREAM SIDE OF 3G
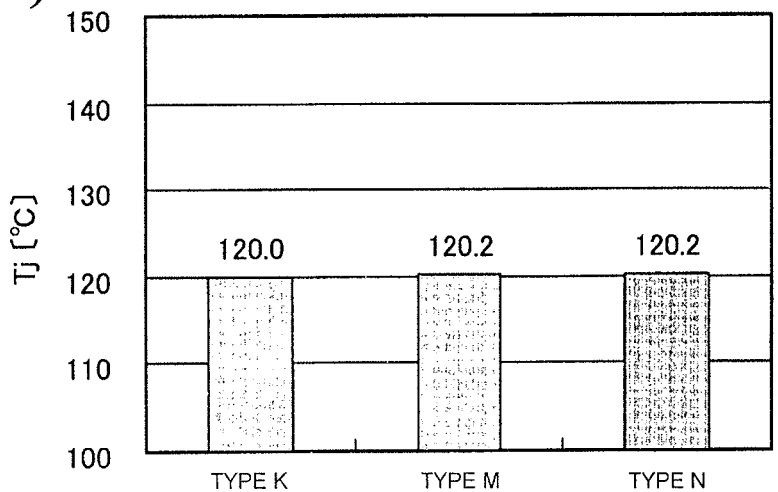
Fig. 22(c) IGBT ON DOWNSTREAM SIDE OF 3Id
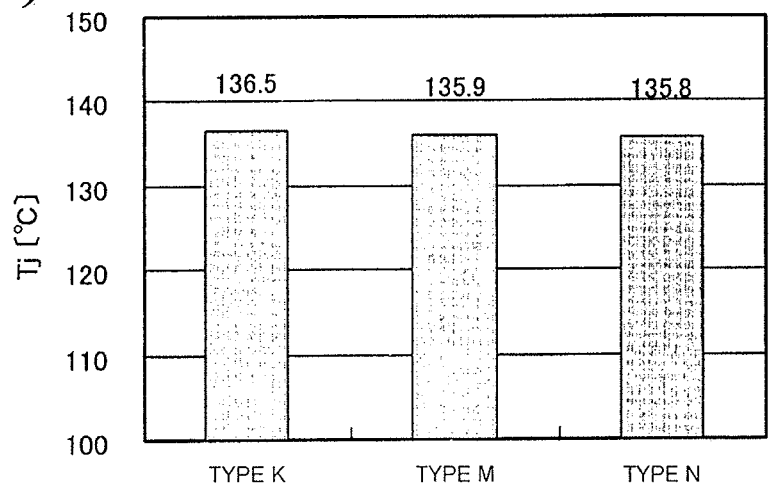

US 9,237,676 B2

SEMICONDUCTOR MODULE COOLER AND SEMICONDUCTOR MODULE

RELATED APPLICATIONS

The present application is National Phase of International Application No. PCT/JP2012/060215 filed Apr. 16, 2012, and claims priority from Japanese Application No. 2011-098700 filed Apr. 26, 2011.

TECHNICAL FIELD

The present invention relates to a semiconductor module cooler which supplies a coolant to a water jacket from outside to cool a semiconductor device arranged on an outer surface of the cooler and to a semiconductor module provided with the semiconductor module cooler.

BACKGROUND ART

For power converters represented in hybrid cars, electric vehicles, and the like, semiconductor modules are widely used. Semiconductor modules that constitute a controller for energy conservation comprise power semiconductor devices in order to control large currents.

Such power semiconductor devices are generating more and more heat when controlling large currents. In particular, the amount of heat generation increases significantly as the sizes of power semiconductor devices are reduced and output of power semiconductor devices is increased. Therefore, with a semiconductor module comprising a plurality of power semiconductor devices, the methods of cooling the power semiconductor devices pose a major problem.

Conventionally, a liquid-cooled cooler (hereinafter, also referred to as a "cooling apparatus") is generally used in a semiconductor module in order to enhance cooling efficiency of the semiconductor module. With liquid-cooled cooling apparatuses which circulate a coolant, various designs have been implemented in order to enhance cooling efficiency such as increasing coolant flow rate, forming radiating fins (cooling body) in a shape with a high heat transfer rate, and increasing thermal conductivity of a material that constitutes the fins.

However, increasing a coolant flow rate to the cooling apparatus or adopting a fin shape with a high heat transfer rate is likely to cause inconveniences such as increased pressure loss of a coolant flowing inside the apparatus. In particular, with a cooling apparatus that cools a large number of power semiconductor devices using a plurality of heat sinks, when using a serpentine flow channel which connects a plurality of flow channels in series, there is a significant increase in pressure loss. A configuration which enhances cooling efficiency with a low coolant flow rate is considered ideal to reduce such pressure loss. While this can be achieved by, for example, increasing thermal conductivity of the fin material, adopting a new fin material may result in increasing overall apparatus cost.

Cooling apparatuses which attempt to reduce pressure loss of a coolant while maintaining cooling performance are being considered in which a coolant introduction flow channel for introducing the coolant and a coolant discharge flow channel for discharging the coolant are arranged parallel to each other and a plurality of heat sinks is arranged between the coolant introduction flow channel and the coolant discharge flow channel in a coolant circulation direction that is approximately perpendicular to the coolant introduction flow channel and the coolant discharge flow channel (refer to Patent Documents 1 to 7). In this case, configuring the heat sinks so that the coolant flows in parallel between respective fins increases cooling performance per pressure loss. In addition, by varying pressure loss per unit flow channel in accordance with a distance of a fin from a semiconductor device, the pressure loss of the coolant in the flow channel as a whole can be reduced and cooling efficiency can be improved (refer to Patent Document 5).

Furthermore, Patent Document 6 describes a liquid-cooled cooling apparatus in which an entire rear sidewall of a casing is smoothly inclined toward the front from a right sidewall side to a left sidewall side, and a flow channel cross-sectional area of an inlet header section decreases from a coolant inlet side to the left sidewall side (refer to paragraphs [0024], [0031] and FIG. 2).

Moreover, Patent Document 3 describes a liquid-cooled cooling apparatus in which flow channels that introduce and discharge a coolant are arranged on a same side surface of a module and the respective flow channels with constant cross-sectional areas are arranged perpendicular to fins (refer to FIG. 1).

Patent Document 1: Japanese Patent Application Laid-open No. 2001-35981
Patent Document 2: Japanese Patent Application Laid-open No. 2007-12722
Patent Document 3: Japanese Patent Application Laid-open No. 2008-205371
Patent Document 4: Japanese Patent Application Laid-open No. 2008-251932
Patent Document 5: Japanese Patent Application Laid-open No. 2006-80211
Patent Document 6: Japanese Patent Application Laid-open No. 2009-231677
Patent Document 7: Japanese Patent Application Laid-open No. 2006-295178

However, with previous cooling techniques, a disproportionate flow distribution where a coolant flows in an uneven manner is created due to shapes of heat sinks or coolant flow channels, arrangement of heater elements, shapes of an inlet and an outlet of a coolant, or the like. With conventional cooling apparatuses, such a disproportionate flow distribution causes unevenness in cooling performance. Therefore, it is difficult to achieve cooling performance that is uniform and stable throughout the entire cooling apparatus. In addition, since inconveniences occur such as a significant rise in heating temperature of only a semiconductor device arranged at a position directly opposite to a side of a coolant outlet, there are problems of reduced device life, greater susceptibility to failure, or the like.

Moreover, when a flow channel cross-sectional area of an inlet header section decreases in a direction in which the flow channel extends as is the case of the cooling apparatuses disclosed in Patent Documents 6 and 7, although flow rate distribution tends to be improved, the improvement does not extend to resolving the problem of increased temperature in a vicinity of a coolant inlet.

The present invention has been made in consideration of the above, and an object of the present invention is to provide a semiconductor module cooler capable of resolving a disproportionate flow that occurs in a coolant flow channel, effectively cooling a semiconductor device arranged on an outer surface of the cooler, and reliably preventing malfunction or destruction attributable to heat generation by the semiconductor device.

DISCLOSURE OF THE INVENTION

Another object of the present invention is to provide a semiconductor module in which a semiconductor device is arranged on an outer surface of such a cooler.

In order to solve the problems described above, a semiconductor module cooler is provided for supplying a coolant to a water jacket from outside and cooling a semiconductor device arranged on an outer surface of the cooler. The semiconductor module cooler comprises a heat sink thermally connected to the semiconductor device; a first flow channel extending from a coolant inlet and arranged inside the water jacket with a guide section having an inclined surface for guiding the coolant toward one side surface of the heat sink; a second flow channel arranged inside the water jacket in parallel to the first flow channel and extending to a coolant outlet, the second flow channel formed with a sidewall in parallel to another side surface of the heat sink; and a third flow channel formed inside the water jacket at a position connecting the first flow channel and the second flow channel. The coolant inlet and the coolant outlet are formed on a same wall surface of the water jacket, and fins of the heat sink are arranged in the third flow channel with equal intervals.

In addition, a semiconductor module according to the present invention comprises a cooler supplying a coolant to a water jacket from outside and cooling a semiconductor device arranged on an outer surface of the cooler. The semiconductor module includes a heat sink thermally connected to the semiconductor device; a first flow channel extending from a coolant inlet and arranged inside the water jacket with a guide section having an inclined surface for guiding the coolant toward one side surface of the heat sink; a second flow channel arranged inside the water jacket in parallel to the first flow channel and extending to a coolant outlet, the second flow channel formed with a sidewall in parallel to another side surface of the heat sink; and a third flow channel formed inside the water jacket at a position connecting the first flow channel and the second flow channel. The coolant inlet and the coolant outlet are formed on a same wall surface of the water jacket, and fins of the heat sink are arranged in the third flow channel with equal intervals.

With the semiconductor module cooler according to the present invention, by setting a cross-sectional area of an introduction channel smaller than that of a discharge channel so that the coolant flows toward one of the side surfaces of a heat sink, a flow velocity of the coolant in the vicinity of the inlet can be increased to resolve increased temperature of the vicinity of the inlet and a flow velocity of the coolant which flows into the heat sink from the first flow channel can be adjusted.

In addition, with the semiconductor module cooler according to the present invention, by providing a separation wall dividing a flow channel of the coolant in the first flow channel, a flow velocity distribution of the coolant can be adjusted while suppressing an increase in pressure loss caused from reducing a cross-sectional area of an introduction channel. Therefore, the semiconductor device arranged on the outer surface of the cooler can be effectively cooled and stable operations of the semiconductor device can be secured.

The above and other objects, characteristics and advantages of the present invention will be more clearly understood from the following detailed description related to the accompanying drawings which represent preferred embodiments of the present invention.

BRIEF DESCRIPTION OF THE DRAWINGS

FIGS. 4(A), 4(B) are diagrams illustrating two shapes of fins, wherein FIG. 4(A) is a perspective view showing blade fins and FIG. 4(B) is a perspective view showing a corrugated fin.

FIGS. 6(A), 6(B) are diagrams illustrating a first modification of a conventional semiconductor module, wherein FIG. 6(A) is a perspective view showing an arrangement example of circuit elements and FIG. 6(B) is a perspective view showing a configuration of a substantial part of a water jacket of a cooler.

FIGS. 9(A), 9(B) are plan views showing a guide section shape of a water jacket used in the semiconductor module according to the present invention.

FIG. 10 is an explanatory diagram showing guide section shapes and flow channel widths of water jackets used in the semiconductor module cooler and the semiconductor module according to the present invention for each type.

FIGS. 14(A), 14(B) are diagrams showing a water jacket used in the semiconductor module according to the present invention, wherein FIG. 14(A) is a plan view showing a guide section shape of a water jacket and FIG. 14(B) is a perspective view showing the water jacket in FIG. 14(A).

FIGS. 15(A), 15(B) are plan views showing a guide section shape of a water jacket of a different type to that in the cooler shown in FIGS. 14(A), 14(B).

FIG. 16 is an explanatory diagram showing guide section shapes and flow channel widths of water jackets used in the semiconductor module cooler and the semiconductor module according to the present invention for each type.

FIGS. 17(A), 17(B) show the respective semiconductor module coolers shown in FIG. 16, wherein FIG. 17(A) is a diagram showing a flow velocity distribution of a coolant for each position on a circuit board and FIG. 17(B) is a diagram showing a pressure difference between an inlet and an outlet of the coolant.

FIGS. 19(A), 19(B) are diagrams showing a water jacket used in the semiconductor module according to the present invention, wherein FIG. 19(A) is a plan view showing a guide section shape of a water jacket and FIG. 19(B) is a partial perspective view showing the water jacket in FIG. 19(A).

FIGS. 21(A), 21(B) show the respective semiconductor module coolers shown in FIGS. 15(A), 15(B), 19(A), 19(B), and 20, wherein FIG. 21(A) is a diagram showing a flow velocity distribution of a coolant for each position on a circuit board and FIG. 21(B) is a diagram showing a pressure difference between an inlet and an outlet of the coolant.

FIGS. 22(A)-22(C) are diagrams showing performances of the water jackets shown in FIGS. 15(A), 15(B), 19(A), 19(B), and 20 for each type.

BEST MODE FOR CARRYING OUT THE INVENTION

Figure 1:
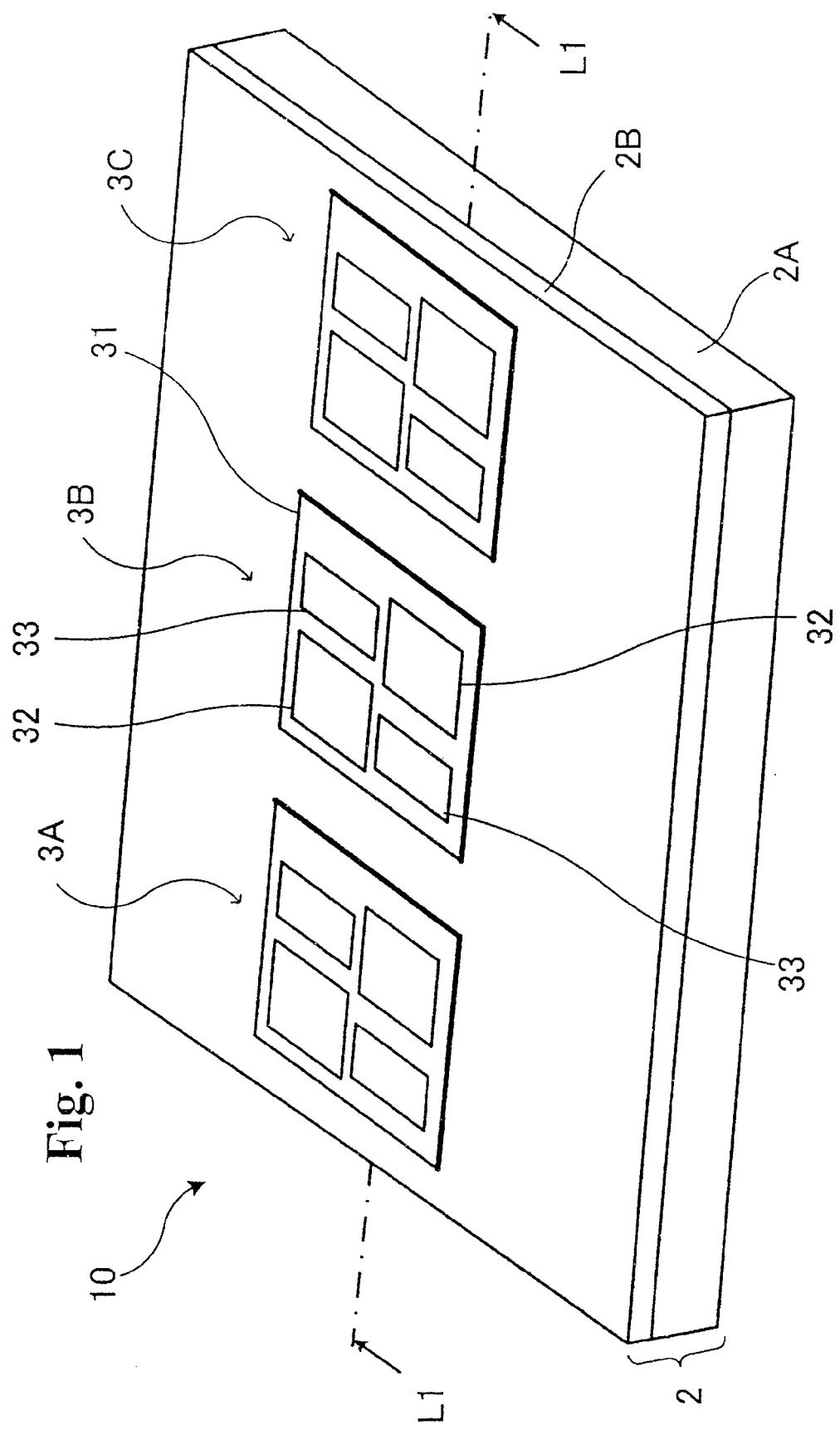
FIG. 1 is a perspective view showing an external appearance of a semiconductor module according to the present invention.
Figure 2:
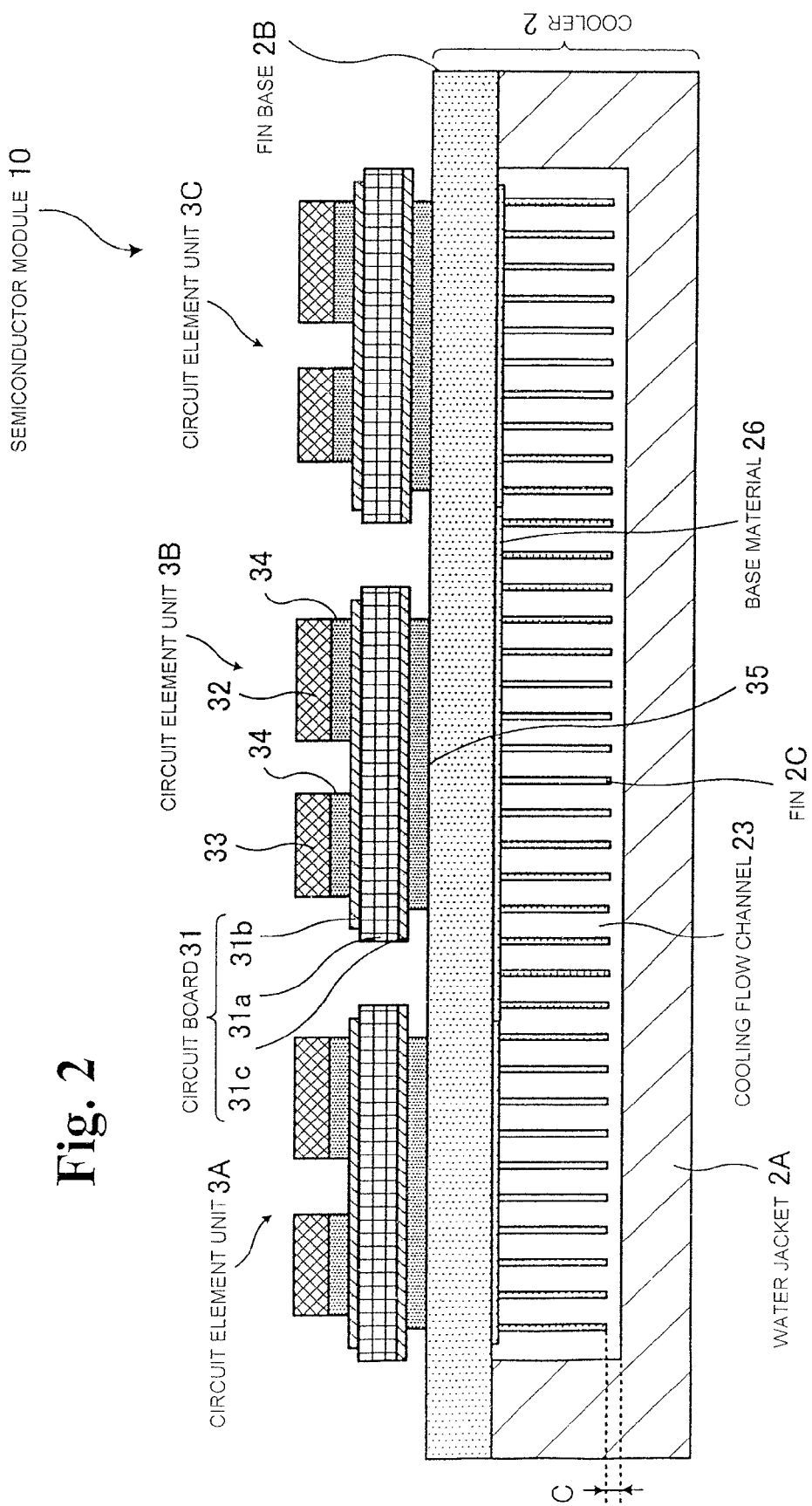
FIG. 2 is a schematic view showing a fragmentary cross sectional view along the line L1-L1 of an example of the semiconductor module shown in FIG. 1.
Figure 3:
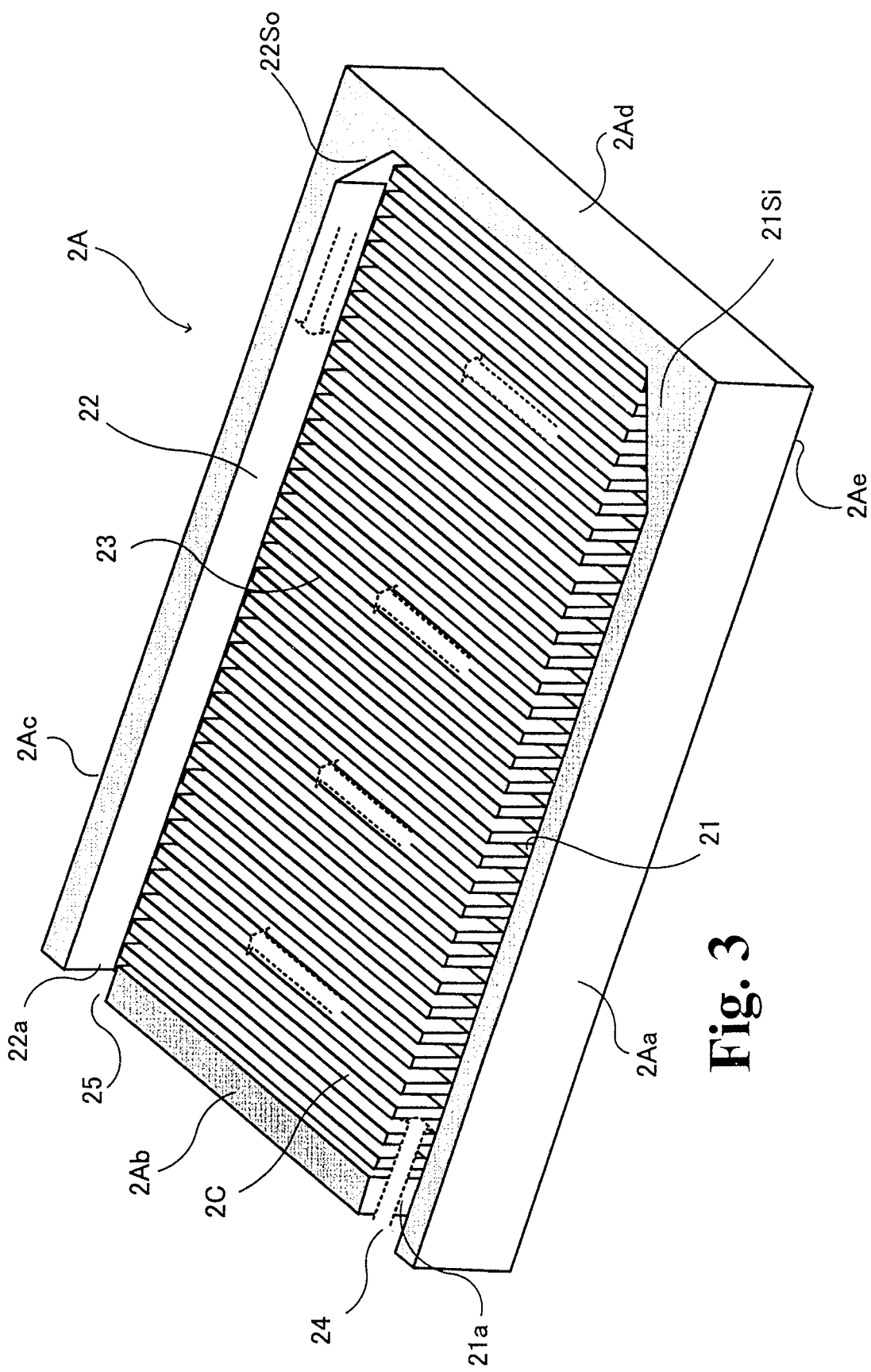
FIG. 3 is a perspective view showing a configuration of a substantial part of a water jacket of a cooler.

FIG. 1 is a perspective view showing an external appearance of a semiconductor module according to the present invention, and FIG. 2 is a schematic view showing a fragmentary cross sectional view along L1-L1 of an example of the semiconductor module shown in FIG. 1. FIG. 3 is a perspective view showing a configuration of a substantial part of a water jacket of a cooler, in which arrows indicate directions in which a coolant flows.

As shown in FIGS. 1 and 2, a semiconductor module 10 comprises a cooler 2 and a plurality of circuit element units 3A to 3C arranged on the cooler 2. The cooler 2 comprises a water jacket 2A as a fin cover and a fin base 2B into which a plurality of fins 2C is implanted as a heat sink, wherein the plurality of fins 2C is housed inside the water jacket 2A.

In the following description, with respect to the water jacket 2A and the fins 2C housed inside the water jacket 2A, a side on which the fin base 2B is attached in FIG. 2 will be referred to as an "upper side", a direction in an arrow view where the upper side of the water jacket 2A is up in FIG. 3 will be referred to as a "front side", a side of the water jacket 2A on which an inlet 24 and an outlet 25 are formed will be referred to as a "left side", and so on. In addition, with respect to a flow of a coolant in the cooler 2, a side close to the inlet 24 will be referred to as an "upstream side".

As shown in FIG. 3, the water jacket 2A of the cooler 2 has an approximately cuboid external shape. A coolant introduction flow channel 21, an inlet section 21a, a coolant discharge flow channel 22, an outlet section 22a, and a cooling flow channel 23 in which the fins 2C are arranged are provided on an upper-side main surface of the water jacket 2A. In addition, the inlet 24 for introducing a coolant into the water jacket 2A is provided on a left sidewall 2Ab of the water jacket 2A and the outlet 25 for discharging the coolant to the outside is provided on the left sidewall 2Ab on a same side surface of the water jacket 2A. The coolant introduction flow channel 21 and the like are defined by a front sidewall 2Aa, the left sidewall 2Ab, a rear sidewall 2Ac, a right sidewall 2Ad, and a bottom wall 2Ae. Moreover, the fins 2C are drawn in FIG. 3 for convenience of illustration.

As the first flow channel, the coolant introduction flow channel 21 extends parallel to the front sidewall 2Aa of the water jacket 2A from the inlet 24 to the right sidewall 2Ad via the inlet section 21a so as to conform to an inflow direction of the coolant. In addition, as the second flow channel, the coolant discharge flow channel 22 linearly extends parallel to the rear sidewall 2Ac from the right sidewall 2Ad to the outlet 25 of the coolant via the outlet section 22a so as to proceed toward the outlet 25. The coolant introduction flow channel 21 and the coolant discharge flow channel 22 are provided approximately parallel to each other. Furthermore, guide sections 21Si and 22So inclined at angles of 60 degrees or less are formed at a trailing end section of the coolant flowing into the coolant introduction flow channel 21 from the inlet 24 and at a starting end section of the coolant discharge flow channel 22 from which the coolant flows out into the outlet 25.

As the third flow channel, the cooling flow channel 23 is arranged between the coolant introduction flow channel 21 and the coolant discharge flow channel 22 and is formed so as to connect the coolant introduction flow channel 21 and the coolant discharge flow channel 22. The cooling flow channel 23 extends in directions respectively perpendicular to the extending direction of the coolant introduction flow channel 21 and the extending direction of the coolant discharge flow channel 22. Inner surfaces of the left sidewall 2Ab and the right sidewall 2Ad which define a boundary of the cooling flow channel 23 are respectively formed perpendicular to a bottom surface of the cooling flow channel 23 and an inner surface of the rear sidewall 2Ac.

A heat sink made up of the plurality of fins 2C is arranged in the cooling flow channel 23 and the coolant flows through a flow channel defined by the fins 2C. The coolant introduced from the inlet 24 passes through the coolant introduction flow channel 21, the cooling flow channel 23, and the coolant discharge flow channel 22 in the water jacket 2A before being discharged from the outlet 25. The heat sink has an approximately cuboid external shape and is arranged in the cooling flow channel 23 so that a left side surface, a rear side surface, and a right side surface of the heat sink are parallel to inner surfaces of the left sidewall 2Ab, the rear sidewall 2Ac, and the right sidewall 2Ad. The plurality of fins 2C is arranged so as to be parallel to the inner surface of the left sidewall 2Ab or the right sidewall 2Ad.

The water jacket 2A configured as described above can be formed using a metal material such as aluminum, an aluminum alloy, copper, and a copper alloy. When forming the water jacket 2A using such a metal material, for example, the coolant introduction flow channel 21, the coolant discharge flow channel 22, the cooling flow channel 23, the inlet 24, and the outlet 25 described above can be formed by die casting. Alternatively, a material containing a carbon filler can be used as the water jacket 2A. In addition, depending on coolant type, a temperature of a coolant flowing through the water jacket 2A, or the like, a ceramic material, a resin material, or the like can also be used.

With the water jacket 2A configured as described above, a side of a formation surface of the coolant introduction flow channel 21, the coolant discharge flow channel 22, and the plurality of the cooling flow channels 23 are sealed by the fin base 2B with the exception of the inlet 24 and the outlet 25 of the coolant as shown in FIGS. 1 and 2. In addition, the plurality of fins 2C is implanted to a base material 26 in the fin base 2B.

Next, a shape of the fins 2C of the cooler 2 will be described.

FIGS. 4(A), 4(B) are diagrams illustrating two shapes of fins, wherein FIG. 4(A) is a perspective view showing blade fins and FIG. 4(B) is a perspective view showing a corrugated fin.

For example, as shown in FIG. 4(A), the fins 2C of the cooler 2 can be formed as a plurality of blade fins 2Ca in which plate-like fins are provided side by side. The blade fins 2Ca are arranged in the cooling flow channel 23 and the coolant circulates in a direction indicated by arrows in FIG. 4(A). In this case, the blade fins 2Ca are held by the base material 26 and the fin base 2B in the cooling flow channel 23.

While the blade fins 2Ca are illustrated in FIG. 4(A), the corrugated fin 2Cb shown in FIG. 4(B) can also be used.

The fins 2C shaped as the blade fins 2Ca or the corrugated fins 2Cb are integrated with the fin base 2B and arranged toward the water jacket 2A on the side of the fins 2C as shown in FIG. 2. The fins 2C are formed in dimensions (heights) which create a constant clearance C between tips of the fins 2C and the bottom wall 2Ae of the water jacket 2A.

In FIG. 2, the base material 26 is configured to be integrated with the fin base 2B. Therefore, when the fin base 2B is arranged so that the side of the fins 2C faces the water jacket 2A, the fins 2C are arranged inside the cooling flow channel 23 of the water jacket 2A. Alternatively, the fins 2C may be formed to be integrated with the fin base 2B itself by die casting, brazing, or the like, or the fins 2C may be formed in convex shapes from the fin base 2B by die casting and then made into fin shapes by wire cutting.

Various conventional and known shapes may be adopted as the fin shapes of the fins 2C described above. Since the fins 2C become a resistance to the coolant flowing inside the cooling flow channel 23, pressure loss of the fins 2C with respect to the coolant is desirably small. In addition, favorably, shapes and dimensions of the fins 2C are set as appropriate in consideration of introduction conditions of the coolant to the cooler 2 (in other words, pump performance and the like), coolant type (viscosity and the like), an intended amount of heat removal, or the like.

Furthermore, an external shape of the heat sink that is made up of the fins 2C is an approximately cuboid shape and favorably a cuboid shape, and may be a chamfered shape or a deformed shape as long as effects of the invention are not undermined.

In a similar manner to the water jacket 2A, the fins 2C and the fin base 2B can be formed using a metal material such as aluminum, an aluminum alloy, copper, and a copper alloy. In addition to the blade fins 2Ca and the corrugated fins 2Cb described above, for example, the fins 2C can be formed by joining predetermined pins or plate bodies formed using a metal material to the metal base material 26.

The base material 26 to which the fins 2C are joined as described above is joined to a predetermined region of the fin base 2B that is a metal plate or the like or, in other words, to a region corresponding to the cooling flow channel 23 shown in FIG. 2. Besides joining the base material 26 to which the fins 2C have been joined in advance as described above to the fin base 2B, a heat sink can also be constructed by directly joining the plurality of fins 2C to the fin base 2B.

When the cooler 2 is in use, for example, the inlet 24 is connected to a pump provided on an upstream side of the inlet 24 and the outlet 25 is connected to a heat exchanger provided on a downstream side of the outlet 25 to construct a closed-loop coolant flow channel which includes the cooler 2, the pump, and the heat exchanger. The coolant is forcibly circulated in such a closed loop by the pump.

For example, as shown in FIG. 2, each of the circuit element units 3A to 3C is configured so that a total of four semiconductor devices including two semiconductor devices 32 and two semiconductor devices 33 are mounted on a substrate 31. For example, as shown in FIG. 2, the substrate 31 is configured so that conductive patterns 31b, 31c are formed on both surfaces of an insulated substrate 31a.

For example, a ceramic substrate made of aluminum nitride, aluminum oxide, or the like can be used as the insulated substrate 31a of the substrate 31. The conductive patterns 31b, 31c on the insulated substrate 31a can be formed using a metal such as copper or aluminum (for example, a copper foil).

The semiconductor devices 32, 33 are joined to a side of the conductive pattern 31b of the substrate 31 using a joining layer 34 such as solder and are electrically connected to the conductive pattern 31b either directly or via wires (not shown). The substrate 31 on which the semiconductor devices 32, 33 are mounted is joined to the fin base 2B of the cooler 2 via a joining layer 35 on the side of the other conductive pattern 31c.

Accordingly, the substrate 31 and the semiconductor devices 32, 33 mounted on the substrate 31 are thermally connected to the cooler 2. Moreover, exposed surfaces of the conductive patterns 31b, 31c and surfaces of the wires that electrically connect the semiconductor devices 32, 33 to the conductive pattern 31b may have protective layers formed thereon by nickel plating or the like in order to protect the surfaces from contamination, corrosion, external forces, and the like.

Figure 5:
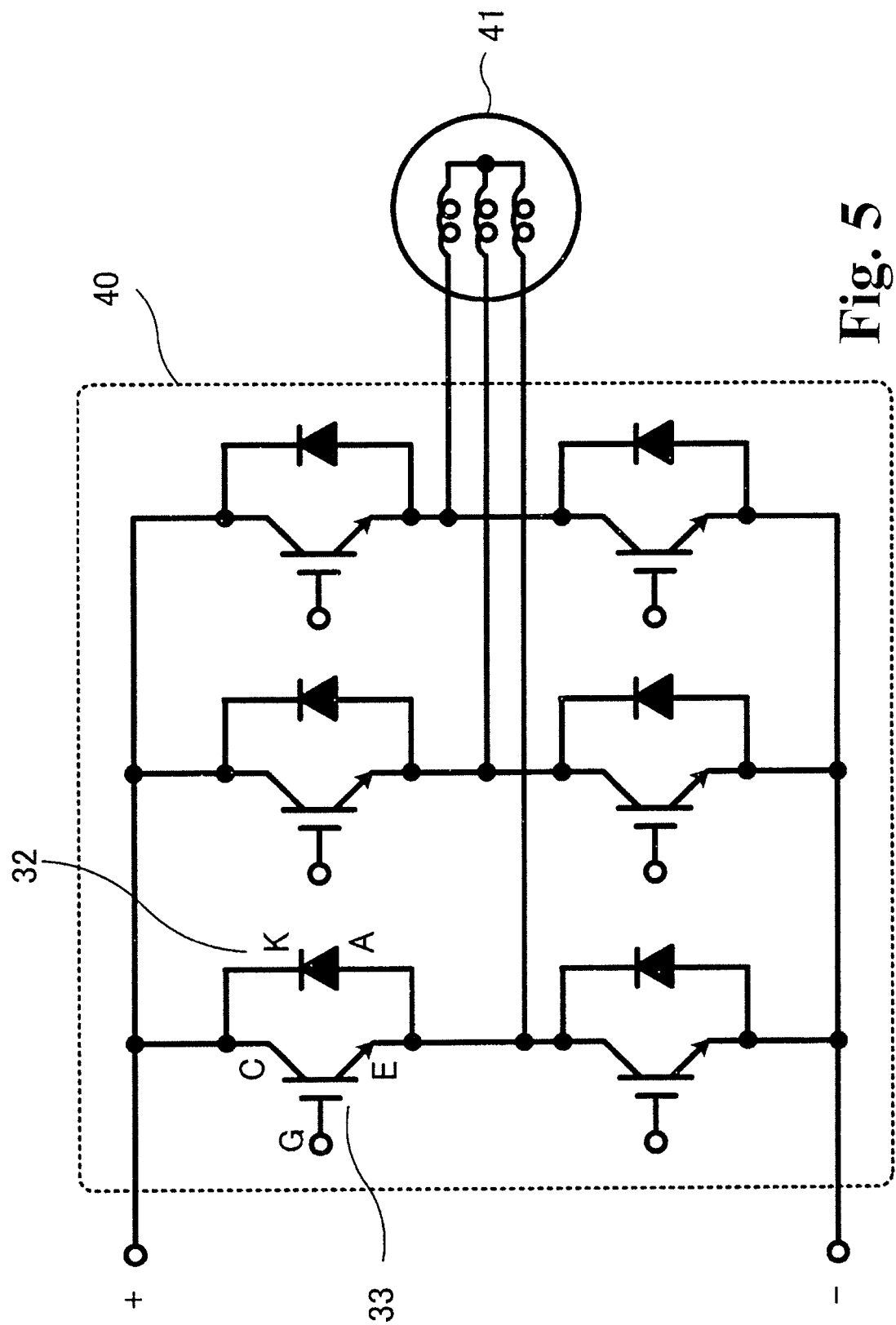
FIG. 5 is a diagram showing an example of a power converter circuit which constitutes a semiconductor module.

FIG. 5 is a diagram showing an example of a power converter circuit which constitutes a semiconductor module.

In this case, power semiconductor devices are used as the semiconductor devices 32, 33 which are mounted on the substrate 31 described above. For example, as shown in FIG. 5, a free wheeling diode (FWD) may be used as one semiconductor device 32 and an insulated gate bipolar transistor (IGBT) may be used as the other semiconductor device 33.

In the semiconductor module 10, for example, an inverter circuit 40 may be constituted by three circuit element units 3A to 3C.

FIG. 5 illustrates an inverter circuit 40 which converts a direct current into an alternating current and supplies the alternating current to a three-phase AC motor 41. For each of the three phases including a U-phase, a V-phase, and a W-phase, the inverter circuit 40 comprises a bridge circuit constituted by the semiconductor device 33 that is an IGBT and the semiconductor device 32 that is an FWD. By controlling switching of the semiconductor device 33, a direct current can be converted into an alternating current and the three-phase AC motor 41 can be driven.

In this case, the circuit element units 3A to 3C configured as described above are arranged on the fin base 2B of the cooler 2. For example, the circuit element units 3A to 3C can be connected so as to constitute an inverter circuit on the cooler 2.

During operation of the power converter circuit configured as described above, heat generated at the respective circuit element units 3A to 3C is transferred to the fin base 2B to which the circuit element units 3A to 3C are joined and further transferred to the fins 2C below the fin base 2B. Since the fins 2C are arranged in the cooling flow channel 23 as described above, the fins 2C are cooled by the circulation of the coolant in the cooling flow channel 23. The circuit element units 3A to 3C which generate heat are cooled by the cooler 2 in this manner.

A case where the semiconductor module 10 is provided with three circuit element units 3A to 3C has been exemplified in the description above. However, the number of circuit element units is not limited to three as is the case with the semiconductor modules shown in FIG. 6 and the like.

Figure 6A:
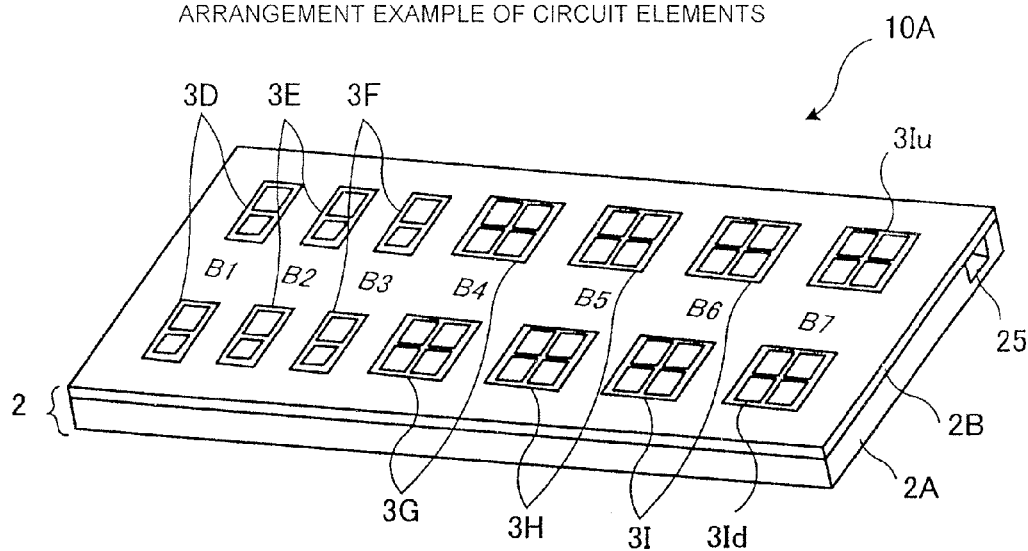
Figure 6B:
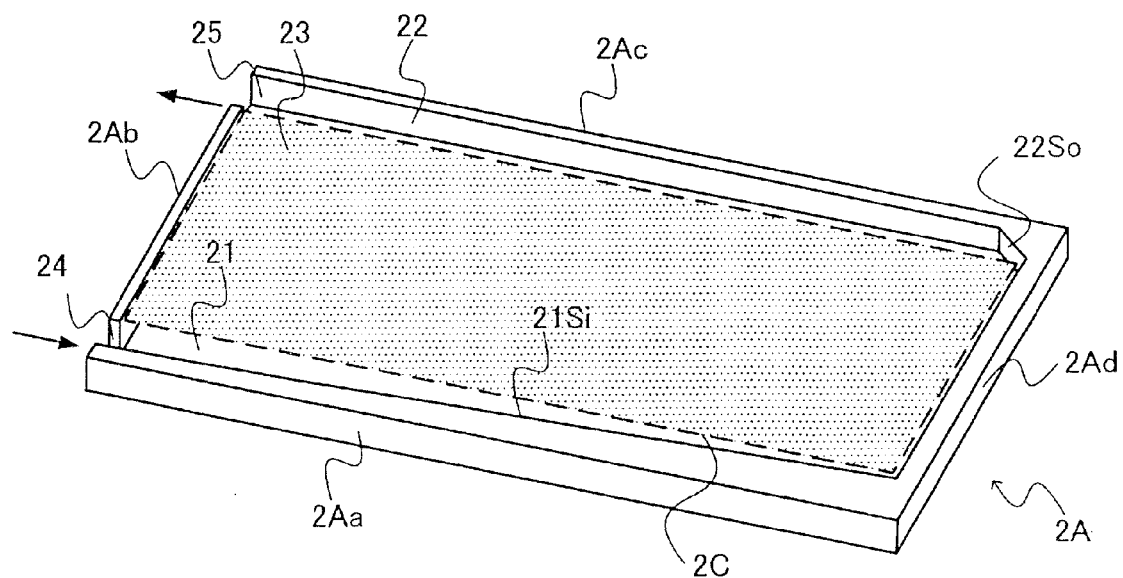
Figure 7A:
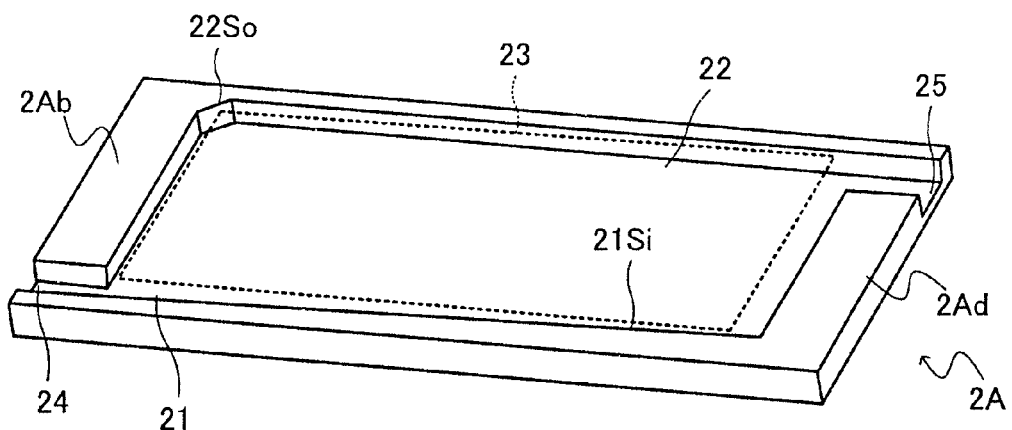
FIGS. 7(A), 7(B) are perspective views showing a shape of a water jacket of a different type to that in the cooler shown in FIG. 6(B).
Figure 7B:
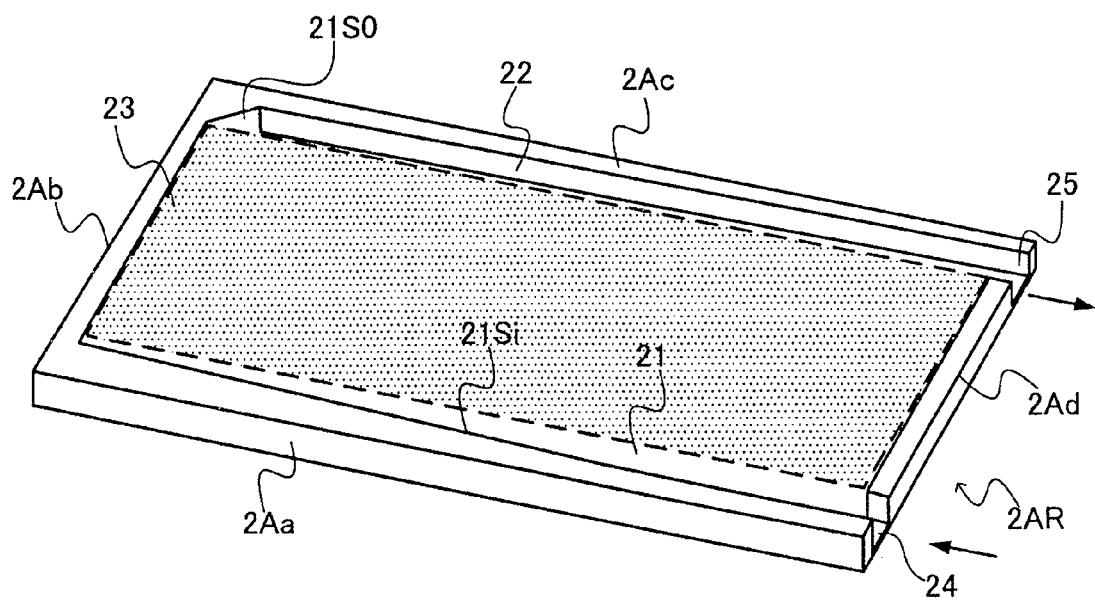

FIGS. 6(A), 6(B) are diagrams illustrating a first modification of a conventional semiconductor module, wherein FIG. 6(A) is a perspective view showing an arrangement example of circuit elements and FIG. 6(B) is a perspective view showing a configuration of a substantial part of a water jacket of a cooler. In addition, FIGS. 7(A), 7(B) are perspective views showing a shape of a water jacket of a different type to that in the cooler shown in FIG. 6(B).

In a semiconductor module 10A shown in FIG. 6(A), a total of 14 circuit element units 3D to 3I, 3Iu, and 3Id are arranged in seven columns (B1 to B7) in a longitudinal direction of the cooler 2 and two rows in a short direction of the cooler 2. The circuit element units 3D to 3I, 3Iu, and 3Id can be appropriately combined and connected so as to constitute a plurality of inverter circuits 40 such as that illustrated in FIG. 5.

As shown in FIG. 6(B), the coolant introduction flow channel 21, the coolant discharge flow channel 22, and the cooling flow channel 23 are provided on one of the main surfaces of the water jacket 2A, and the cooling flow channel is formed in a size corresponding to the fins 2C. For example, as shown in FIG. 2, the fins 2C are integrated with the fin base 2B and arranged facing the water jacket 2A on the side of the fins 2C. In addition, the fin base 2B that is eventually integrated with the fins 2C is arranged on the water jacket 2A as shown in FIGS. 1 and 2.

The fin base 2B and the water jacket 2A are joined to each other using a suitable sealing material (not shown). Accordingly, the cooler 2 comprising the water jacket 2A, the fin base 2B, and the fins 2C can be constructed. Furthermore, guide sections 21Si and 22So inclined at angles of 60 degrees or less are formed at a trailing end section of the coolant flowing into the coolant introduction flow channel 21 from the inlet 24 and at a starting end section of the coolant discharge flow channel 22 through which the coolant flows out into the outlet 25. The guide section 21Si is a uniform inclined surface over an entire region that faces the cooling flow channel 23.

In this case, a type (type A) in which the inlet 24 and the outlet 25 are arranged on a side of a same surface of the left sidewall 2Ab is shown. However, in practice, a plurality of types with different shapes is conceivable depending on connections of piping for introducing the coolant including a type B shown in FIG. 7(A) in which the inlet 24 and the outlet are arranged at opposing positions on the left and right sidewalls 2Ab and 2Ad that face each other and a type C shown in FIG. 7(B) in which the inlet 24 and the outlet 25 are arranged on the right sidewall 2Ad. However, with every shape, flow channel shapes must be optimized.

Figure 8:
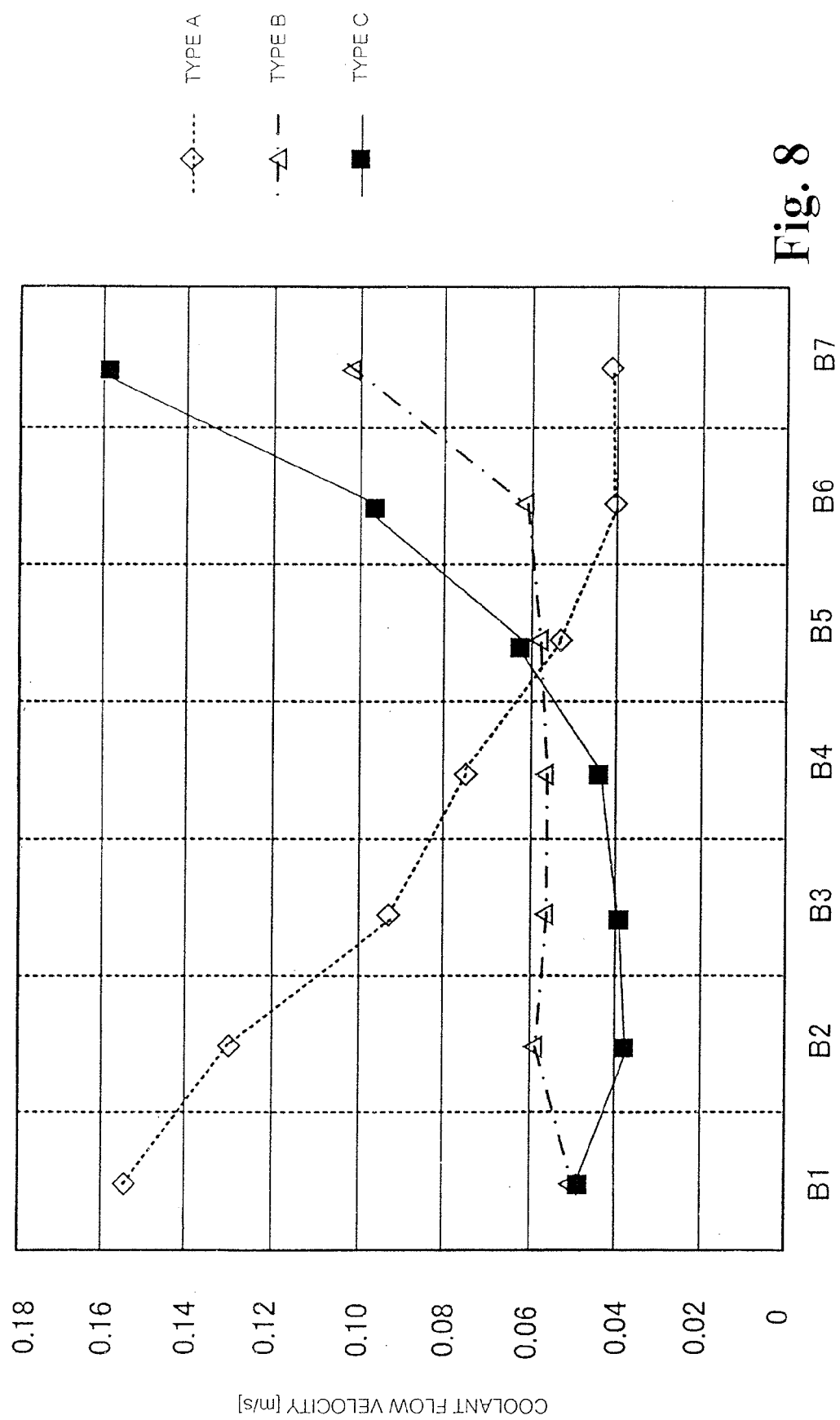
FIG. 8 is a diagram showing flow velocities of a coolant in the semiconductor modules shown in FIGS. 6(A), 6(B) and 7(A), 7(B) for each position on a circuit board.

FIG. 8 is a diagram showing flow velocities of a coolant in the semiconductor modules shown in FIGS. 6(A), 6(B) and 7(A), 7(B) for each position on a circuit board.

As one example, the graph in FIG. 8 shows a flow velocity of a coolant which flows between the blade fins 2Ca shown in FIG. 4(A) when the blade fins 2Ca are arranged in the cooling flow channel 23 and the coolant is introduced from the inlet 24 at a flow rate of 10 L/min.

As is apparent from the graph shown in FIG. 8, the water jackets of types A, B, and C have disproportionate flow characteristics where a flow velocity distribution is uneven for each flow channel shape. With the water jackets of type A and type C in which the inlet 24 and the outlet 25 are arranged on the same surface, the flow velocity of the coolant is high on the sides of B1 and B7 where piping is connected and reach 0.15 m/seconds or higher in both cases. With a water jacket in which the inlet 24 and the outlet 25 are arranged at symmetrical positions such as type B, the flow velocity of the coolant is highest at the position B7 on the side of the outlet 25. As shown, the coolant in the cooling flow channel 23 has disproportionate flow characteristics in which flow velocity is higher on the side of the outlet 25 among the parallel flow channels formed by the blade fins 2Ca between the coolant introduction flow channel 21 and the coolant discharge flow channel 22.

In addition, with the conventional semiconductor module 10A shown in FIG. 6(A), circuit element units with different configurations may be arranged as the two circuit element units 3Iu and 3Id in the seventh column on the cooler 2 separate from the 12 circuit element units 3D to 3I which are arranged in two rows and six columns. In this case, for example, the 12 circuit element units 3D to 3I can be appropriately combined to constitute a plurality of inverter circuits 40 such as that illustrated in FIG. 5. Furthermore, for example, the circuit element units 3Iu and 3Id may be configured as boost converter circuits using a predetermined number of IGBTs and FWDs.

In such a case, for example, the circuit element units 3Iu and 3Id of the boost converter circuits are connected to a battery and the inverter circuit 40 described above to boost battery voltage by the circuit element units 3Iu and 3Id. A circuit construction can be realized in which the boosted direct current is converted into an alternating current by the inverter circuit 40 and the alternating current is supplied to the three-phase AC motor 41.

Moreover, in consideration of wiring layout and the like with respect to circuit design, circuit production, or the like, circuit element units 3Iu and 3Id which differ in type from the circuit element units 3D to 3I can be relatively easily added by arranging the circuit element units 3Iu and 3Id at end sections of the semiconductor module 10A as shown in FIG. 6(A).

With such a semiconductor module 10A, there are two heat generating locations inside the fins 2C along a circulating direction of the coolant that flows through the cooling flow channel 23 of the cooler 2. In addition, the heat generating locations are separated from each other on an upstream side and a downstream side with respect to the direction in which the coolant flows. Among the separate locations, a temperature of the coolant flowing on the downstream side has already risen due to absorption of heat on the upstream side. Therefore, cooling efficiency of the circuit element units arranged on the upstream side is further enhanced.

Furthermore, the coolant flowing through the cooling flow channel 23 of the cooler 2 has the disproportionate flow characteristics described above in which coolant flow velocity increases at positions near the outlet 25. In addition, the faster the flow of the coolant at a location in the cooling flow channel 23, the higher the cooling efficiency by the fins 2C at the location.

Moreover, the amounts of heat generated by the circuit element units 3D to 3I, 3Iu, and 3Id when driven are not the same and often differ depending on functions.

In consideration of such circumstances, by arranging a circuit element unit that generates the largest amount of heat when driven among the circuit element units 3D to 3I, 3Iu, and 3Id on the side of the coolant introduction flow channel 21 near the outlet 25, cooling can be facilitated.

However, depending on the circumstance in which the semiconductor module 10A is used, there may be cases where the circuit element unit that generates the largest amount of heat cannot be arranged at a position near the outlet 25 and can only be arranged at a position separated from the outlet 25. In addition, with the semiconductor module 10A, the coolant must be circulated at a certain flow velocity or higher in accordance with the amount of heat generated by the circuit element units 3D to 3I, 3Iu, and 3Id. However, simply increasing the flow rate of the coolant from the inlet 24 in order to increase the flow velocity at a low flow velocity section results in an excessive amount of the coolant flowing at a portion with an originally high flow velocity and a desirable effect cannot be obtained. Increasing the flow velocity at a low flow velocity section calls for the coolant to be supplied to the cooler at a greater coolant flow rate and requires a high-performance pump.

In consideration thereof, the flow channel shape of the cooler 2 must be improved to control flow velocity distribution and remedy disproportionate flow characteristics. A simulation of such flow channel characteristics requires a thermo-fluid analysis which takes physical phenomena such as coolant flow, thermal conduction, and heat transfer into consideration. In addition, a temperature rise of the coolant due to heat generated at the circuit element units 3D to 3I, 3Iu, and 3Id may be obtained through analysis by applying a generation loss that occurs in a steady operation state.

A simulation of the flow velocity distribution of a coolant using water jackets 2A of conventional types A to C shown in FIGS. 6(B), 7(A), and 7(B) reveals that the coolant introduced into the water jackets 2A from the inlet 24 flows as though being drawn to the position of the outlet 25. Therefore, as shown in FIG. 8, the coolant flowing into the cooling flow channel 23 flows at a relatively high velocity on a side near the outlet 25 of the coolant.

Generally, at the flow channels below the circuit element units 3D to 3I, 3Iu, and 3Id which are arranged in plurality, a flow velocity of the coolant that is required for cooling must be maintained in accordance with the generation loss at the semiconductor devices 32, 33. In addition, if the flow velocity distribution of the coolant increases due to the disproportionate flow characteristics described earlier, the cooling performance of the coolant similarly becomes disproportionate distribution. On the side of the outlet 25 where the flow velocity in the cooling flow channel 23 is high, a variation in cooling performance relative to a variation in flow velocity is small. On the other hand, on the side of the inlet 24 where flow velocity is likely to decline, a variation in cooling performance is large. With the example shown in FIG. 8, when the flow velocity of the coolant is equal to or lower than 0.05 m/s, a variation in flow velocity has a large impact on cooling performance. However, once the flow velocity of the coolant exceeds 0.05 m/s, a variation in flow velocity only causes a small variation in cooling performance. This trend is shared by the semiconductor module coolers described in the following embodiments.

This simulation result indicates that a flow velocity component which does not contribute to the improvement of cooling performance is created on the side of the outlet 25. In consideration thereof, if such disproportionate flow characteristics can be remedied and flow velocities at locations separated from the outlet 25 can be raised, in addition to obtaining a more stable cooling performance, overall cooling performance can be improved and various arrangements of the circuit element units can be realized without having to use a large pump.

In addition, the disproportionate flow characteristics of the coolant is a phenomenon that occurs in the parallel flow channels in the cooling flow channel 23 that is sandwiched between the coolant introduction flow channel 21 and the coolant discharge flow channel 22. In particular, when intervals of the cooling fins 2C arranged in the cooling flow channel 23 are increased, resistance that acts on the coolant flowing from the coolant introduction flow channel 21 to the fins 2C decrease and the coolant flows into the cooling flow channel 23 more easily. Therefore, with shapes of the fins 2C in the cooling flow channel 23, the greater the intervals between the fins 2C, the greater the disproportionate flow characteristics. Moreover, methods of cooling the circuit element units in types A to C shown in FIGS. 6(A), 6(B) and 7(A), 7(B) in a manner that is uniform and safe as possible differ depending on the disproportionate flow characteristics described above and on a distribution of generation loss of the circuit element units arranged on the fin base 2B.

In the embodiments below, improvements made for the purpose of adjusting a flow velocity distribution in a semiconductor module in which the inlet 24 and the outlet 25 are arranged on a same surface as is the case of the conventional type A water jacket 2A shown in FIGS. 6(A), 6(B) will be described. The embodiments are all based on results of evaluations performed by simulating characteristics of the coolant itself (coolant characteristics) and cooling performances.

First Embodiment

In the first embodiment, a cooler 2 in which a width of the coolant introduction flow channel 21 has been reduced in order to adjust a disproportionate flow in the semiconductor module will be described.

FIGS. 9(A), 9(B) are plan views showing a guide section shape of a water jacket used in the semiconductor module according to the present invention. In the two water jackets 2A shown in FIGS. 9(A) and 9(B), the inlet 24 and the outlet 25 are arranged on the left sidewall 2Ab thereof in a similar manner to the conventional type A shown in FIG. 6(B). However, the inlet section 21a which guides the coolant from the inlet 24 to the coolant introduction flow channel 21 and the outlet section 22a for effusing the coolant from the coolant discharge flow channel 22 to the outlet 25 are formed longer than those shown in FIG. 6(B) and FIG. 3. In other words, the inlet section 21a and the outlet section 22a are formed so as to protrude from the same left sidewall 2Ab.

In a type D water jacket 2A shown in FIG. 9(A), the inlet section 21a and the outlet section 22a are formed with widths respectively equal to the inlet 24 and the outlet 25. For example, the widths are set the same to w1 (=15 mm). The coolant introduction flow channel 21 has a guide section 21Si on an inner surface side of the front sidewall 2Aa facing a front side surface (coolant inflow surface) of the fins 2C arranged in the cooling flow channel 23. The guide section 21Si narrows down the width of the coolant introduction flow channel 21 toward a trailing end thereof. The type D water jacket 2A is also similar in this regard to the type A water jacket 2A shown in FIG. 6(B) described earlier. The guide section 21Si arranged in the coolant introduction flow channel 21 is defined by an inclined surface length x from a trailing end section and a distance y between the guide section 21Si at the trailing end section of the coolant introduction flow channel 21 and the fins 2C.

In a type G water jacket 2A shown in FIG. 9(B), a cross section at the inlet section 21a which guides the coolant to the coolant introduction flow channel 21 is formed in a tapered shape, and a flow channel width of the inlet section 21a is varied so that a flow channel width w2 at a starting end section of the coolant introduction flow channel 21 is narrower than a flow channel width w1 at the outlet 25. Moreover, a distance from the fins 2C at the trailing end section of the coolant introduction flow channel 21 or, in other words, the distance y is similar to that of type D. In this configuration, while the coolant discharge flow channel 22 is formed with a uniform flow channel width w1, the flow channel width w2 of the coolant introduction flow channel 21 at the starting end section thereof is narrower and decreases toward the trailing end. Therefore, if the guide section 21Si arranged in the coolant introduction flow channel 21 has an inclined surface with a length x which corresponds to an entire region of the guide section 21Si, an angle of inclination of the guide section 21Si is smaller than that of type D.

In the respective flow channel shapes shown in FIGS. 9(A) and 9(B), a guide section 22So is arranged at the starting end section in the coolant discharge flow channel 22 which effuses the coolant to the outlet 25. The guide section 22So is chamfered at an angle of inclination of approximately 45 degrees with respect to a rear side surface (coolant outflow surface) of the fins 2C. In addition, the rear sidewall 2Ac is formed parallel to the rear side surface of the fins 2C toward a downstream side of the coolant discharge flow channel 22. In other words, a sidewall of the coolant discharge flow channel 22 is formed parallel to the rear side surface of the fins 2C over almost the entire length of the coolant discharge flow channel 22. Therefore, pressure loss can be reduced at the downstream side of the heat sink (the coolant outflow surface of the fins 2C) and an effect of flow velocity adjustment by the guide section 21Si can be produced.

FIG. 10 is an explanatory diagram showing guide section shapes and flow channel widths of water jackets used in the semiconductor module cooler and the semiconductor module according to the present invention for each type.

In addition to type D and type G shown in FIGS. 9(A), 9(B), guide section shapes (an inclined surface length x, a distance y at the trailing end section) and flow channel widths (w1, w2) of water jackets of type E, type Ea, type Eb, type F, type Ga, and type Gb will be described. In the type D water jacket 2A, the guide section 21Si arranged in the coolant introduction flow channel 21 is shaped so that a length x thereof is equal to the coolant introduction flow channel 21 and set to 255 mm and that the flow channel width (distance y) of the coolant introduction flow channel 21 at the trailing end section thereof is set to 2 mm. Moreover, both flow channel widths of the inlet section 21a and the outlet section 22a are formed to be the same and set to w1 (=15 mm).

In type E, while x and y are respectively the same as in type D and set to 255 mm and 2 mm, type E differs from type D in that the flow channel width of the inlet section 21a is varied so as to be narrowed down from 15 mm (w1) to 10 mm (w2). In addition, in the type Ea water jacket 2A, the guide section 21Si arranged in the coolant introduction flow channel 21 has an inclined surface length x of 130 mm that is shorter than the coolant introduction flow channel 21, and a flow channel width of the coolant introduction flow channel 21 at the trailing end section thereof is set to 2 mm. Furthermore, in the guide section 21Si of type Eb, an inclined surface is formed in a range of 8 mm (x) in a vicinity of the trailing end section of the coolant introduction flow channel 21 and the flow channel width is set to 2 mm. In other words, the coolant introduction flow channel 21 has a length of 247 mm and a flow channel width of 10 mm, and the guide section 21Si forms a 45-degree inclined surface only at the trailing end section of the coolant introduction flow channel 21.

With the type F water jacket 2A, while the inclined surface length x and the flow channel width at the trailing end section (distance y) are the same as type D and type E and are set to 255 mm and 2 mm, the flow channel width at the inlet section 21a is varied so as to decrease from 15 mm (w1) to the flow channel width 8 mm (w2) at the starting end section of the coolant introduction flow channel 21. Therefore, an angle of inclination of the guide section 21Si that is arranged with an inclined surface length x of 255 mm in the coolant introduction flow channel 21 is smaller than that in type D.

In the type G water jacket 2A, as shown in FIG. 9(B), the guide section 21Si arranged in the coolant introduction flow channel 21 is shaped so that the inclined surface length x thereof is equal to the coolant introduction flow channel 21 and set to 255 mm and that the flow channel width (distance y) of the coolant introduction flow channel 21 at the trailing end section thereof is set to 2 mm. In addition, due to the inlet section 21a with a tapered shape, the coolant introduction flow channel 21 has a width of 5 mm (w2) at the starting end section thereof which is even narrower than in type F. Furthermore, in type Ga, the guide section 21Si arranged in the coolant introduction flow channel 21 is shaped so that the inclined surface length x thereof is set to 130 mm that is shorter than the coolant introduction flow channel 21 and the flow channel width (distance y) of the coolant introduction flow channel 21 at the trailing end section thereof is set to 2 mm. Moreover, in type Gb, a shape is adopted such that the guide section 21Si is only formed in a vicinity of the trailing end section of the coolant introduction flow channel 21 in a range of 3 mm (x) and the flow channel width (distance y) is set to 2 mm. In other words, the coolant introduction flow channel 21 has a length of 252 mm and a flow channel width of 5 mm, and the guide section 21Si forms a 45-degree inclined surface at the trailing end section of the coolant introduction flow channel 21.

As shown, with all of the flow channel shapes of types E to G shown in FIGS. 9(A), 9(B), and 10, the flow channel width is narrowed down from w1 to w2 at the inlet section 21a that precedes the coolant introduction flow channel 21. In addition, as in type E, type Ea, type Eb, type Ga, and type Gb, by combining respectively varied flow channel widths (w1, w2) and guide section shapes (x, y), a flow velocity of the coolant that proceeds toward the trailing end section in the coolant introduction flow channel 21 can be suppressed to an appropriate level. Furthermore, even if the cross-sectional area of the inlet 24 is the same, by arranging the inlet section 21a whose cross-sectional area decreases continuously decreases in an introduction direction of the coolant, a flow velocity distribution in the cooling flow channel 23 can be improved. This point will be described below with reference to FIGS. 11 to 13.

Next, a result of a simulation performed with the water jackets 2A having the flow channel shapes shown in FIG. 10 as a target for comparison will be described. The simulation assumed a case where the cooling flow channel 23 is formed in a region with a width of 255 mm and a length of 117 mm, blade fins 2Ca with a thickness of 1.2 mm, a pitch of 2.1 mm, and a height of 10 mm are arranged in the cooling flow channel 23, and a coolant is introduced into the coolant introduction flow channel 21 from the inlet 24 at a flow rate of 10 L/min. In addition, by simulating shapes of guide sections 21Si which differ from one another, an impact of a difference in shapes of the guide section 21Si on flow velocity distribution was confirmed for each of the types D to G.

Figure 11:
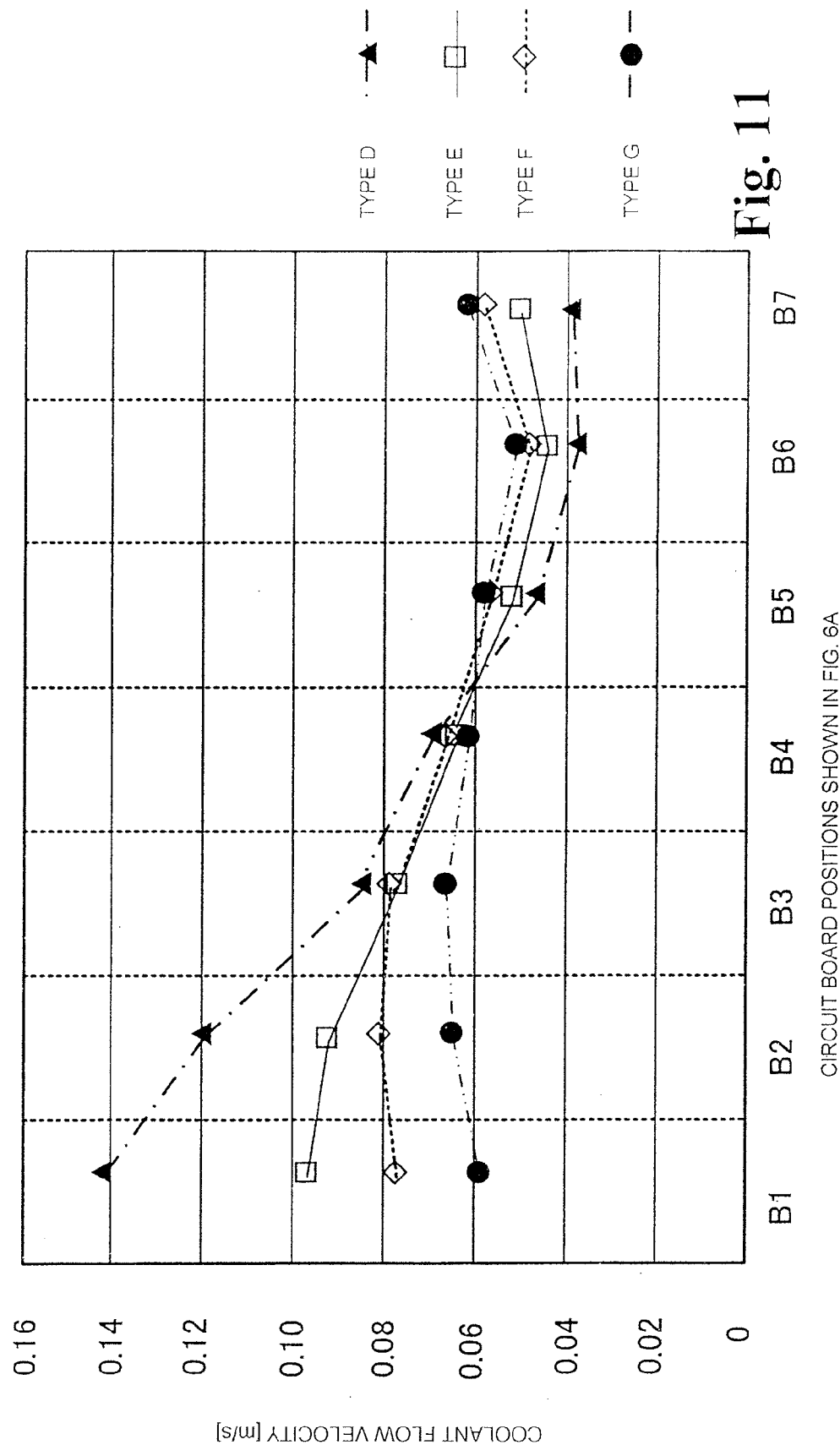
FIG. 11 is a diagram showing a flow velocity distribution of a coolant in the semiconductor module cooler according to the present invention for each position on a circuit board and for each type.

FIG. 11 is a diagram showing a flow velocity distribution of a coolant in the semiconductor module cooler according to the present invention for each position on a circuit board and for each type.

The flow velocity distribution shown in FIG. 11 represents a result of a simulation of flow velocity between fins 2C arranged directly under a central section of a substrate of the circuit element units 3D to 3I, 31Iu, and 31Id arranged in seven columns indicated by the positions B1 to B7 in FIG. 6(A). Flow velocities are shown in an order of B1 to B7 from the side of the inlet 24 toward the trailing end section of the coolant introduction flow channel 21.

The coolant introduction flow channels 21 of types D to G used in the simulation of flow velocity distribution have the guide section shapes and the flow channel widths shown in FIG. 10, and a minimum value (y) of intervals between the fins 2C and the guide section 21Si is set to 2 mm for all types. In addition, the flow channel width w1 of the inlet 24 and the outlet 25 is set to a constant 15 mm, and the flow channel width w2 at the starting end section of the coolant introduction flow channel 21 is varied within a range of 15 mm to 5 mm. Moreover, the total length of the coolant introduction flow channel 21 is set to 255 mm and a height thereof is set to 10.5 mm.

According to the simulation result shown in FIG. 11, as is apparent from the results of types E to G, flow velocity decreases on a side of the position B1 that is close to the inlet 24 and the outlet 25 and increases on the side of the position B7 which requires cooling. In addition, in the flow channel according to the present embodiment, almost uniform disproportionate flow characteristics can be obtained by setting the flow channel width w2 of the coolant introduction flow channel 21 to ⅓ of the coolant discharge channel as in the case of type G. In other words, it was found that by further reducing the flow channel width w2, flow velocity distribution dependent on a position of the outlet 25 can be improved.

Among the flow velocities at the position B7 that is furthest from the inlet 24 and the outlet 25 for every type, while the flow velocity for type D is 0.040 m/s, the flow velocity for type E is 0.053 m/s, and the flow velocity for type F is 0.059 m/s, the flow velocity for type G is 0.064 m/s. As shown, the flow velocity at the position B7 exceeds 0.06 m/s only with the water jacket of type G in which the flow channel width of the coolant introduction flow channel 21 is set narrowest.

The above demonstrates that even with a configuration in which the inlet 24 and the outlet 25 of the cooling apparatus are arranged on the side of a same surface of the water jacket, by narrowing down the flow channel width w2 of the coolant introduction flow channel 21 of the cooling apparatus to 5 mm, a disproportionate flow distribution can be adjusted to be uniform and a flow velocity distribution with higher cooling efficiency can be obtained. According to such simulation results, for flow channels having the guide section shapes and the flow channel widths of the water jackets of the different types shown in FIG. 10, respectively, a heat generation state of power semiconductor devices can be confirmed based on generation loss at the circuit element units 3D to 3I, 3Iu, and 3Id.

Figure 12A:
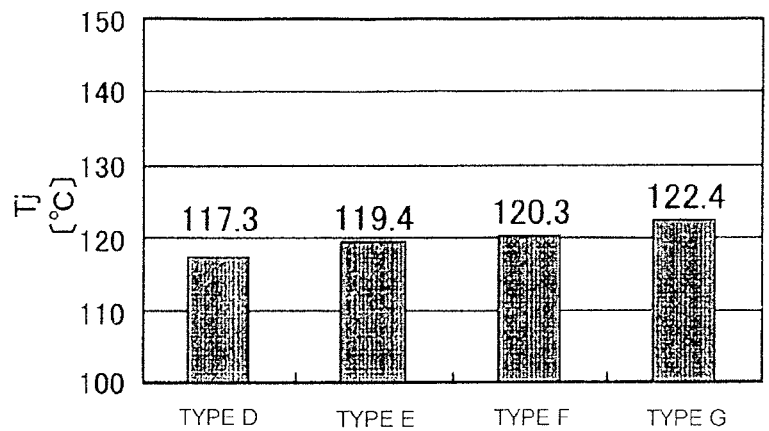
FIGS. 12(A)-12(C) are diagrams showing a heating temperature in a steady state of the water jackets shown in FIG. 10 for each type.
Figure 12B:
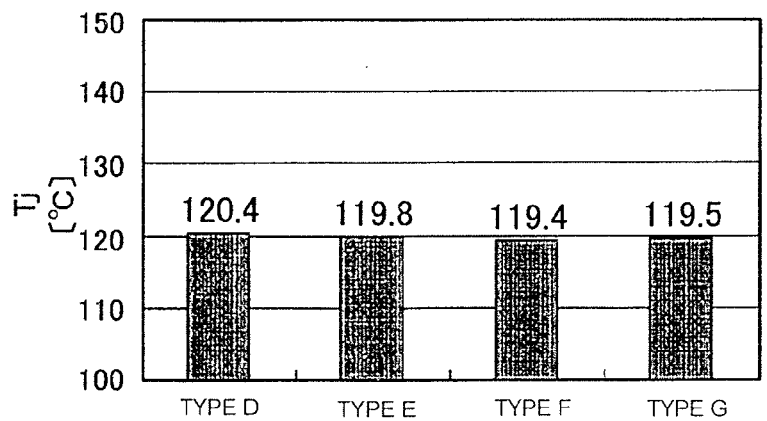
Figure 12C:
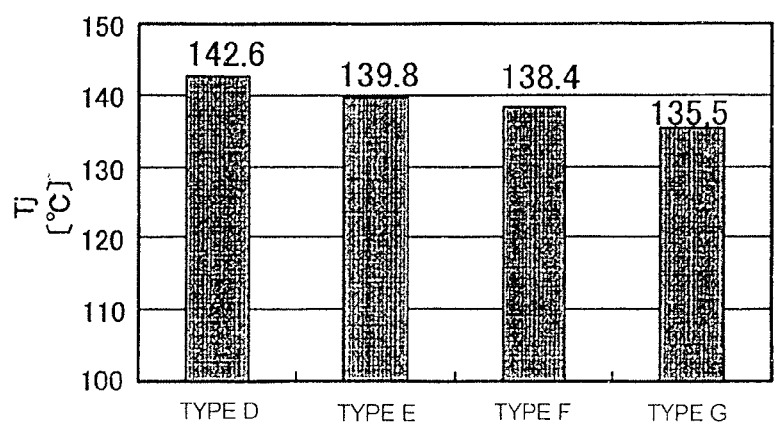

FIGS. 12(A)-12(C) are diagrams showing a heating temperature in a steady state of the water jackets shown in FIG. 10 for each type. All of the heating temperatures represent examples of a result of a simulation performed according to the method described earlier.

In the simulation, as the generation loss to be applied to the circuit element unit 3D and the like, the circuit element units are divided into two groups of three columns each from the side of the inlet 24 as shown in FIG. 6(A) described earlier, with one group containing positions B1 to B3 of the circuit element units 3D to 3F and the other group containing positions B4 to B6 of the circuit element units 3G to 3I, whereby the generation loss to be applied is set the same for circuit element units in the same group. In addition, with the circuit element units 3Iu and 3Id in the seventh column, different generation losses are set for the upstream-side circuit element unit 3Id and the downstream-side circuit element unit 3Iu. IGBT devices respectively arranged on downstream sides of the first-column (B1) circuit element unit 3D and the fourth-column (B4) circuit element unit 3G are set as targets for comparison for heating temperatures in FIGS. 12(A), 12(B). Furthermore, in FIG. 12(C), an IGBT device on an upstream side of whichever circuit element unit has greater generation loss among the circuit element units 3Iu and 3Id of the seventh column (B7) is set as the target for comparison. Moreover, generation loss values respectively set to the circuit element units 3D to 3I, 3Iu, and 3Id in accordance with amounts of heat generation thereof are set so as to satisfy 3D<3G<3Iu<3Id based on a relationship among coolant flow velocity, coolant temperature, and cooling performance.

As shown in FIG. 12(C), a junction temperature Tj of the circuit element unit 3Id is 142.6° C. for type D but 135.5° C. for type G, which represents a reduction effect of 7.1° C. Similarly, with the other circuit element units 3D, 3G shown in FIGS. 12(A), 12(B), while the junction temperature Tj increases with a variation in flow velocity distribution, the junction temperature Tj is lower than that of the circuit element unit 3Id with the greatest generation loss and is kept to or below 123° C. in both cases. This indicates that by respectively adjusting flow velocity distribution to a level commensurate with the generation loss at the circuit element units 3D to 3I, 3Iu, and 3Id, stable cooling performance can be obtained.

As described above, with the water jacket used in the semiconductor module according to the present invention, improving the shape of a guide section including a width and an inclination thereof has a significant effect on improving flow velocity particularly directly below a central part of a substrate (B7) of the circuit element unit 3Id which has a high loss value, and enables reduction of a junction temperature of a power semiconductor device.

Figure 13:
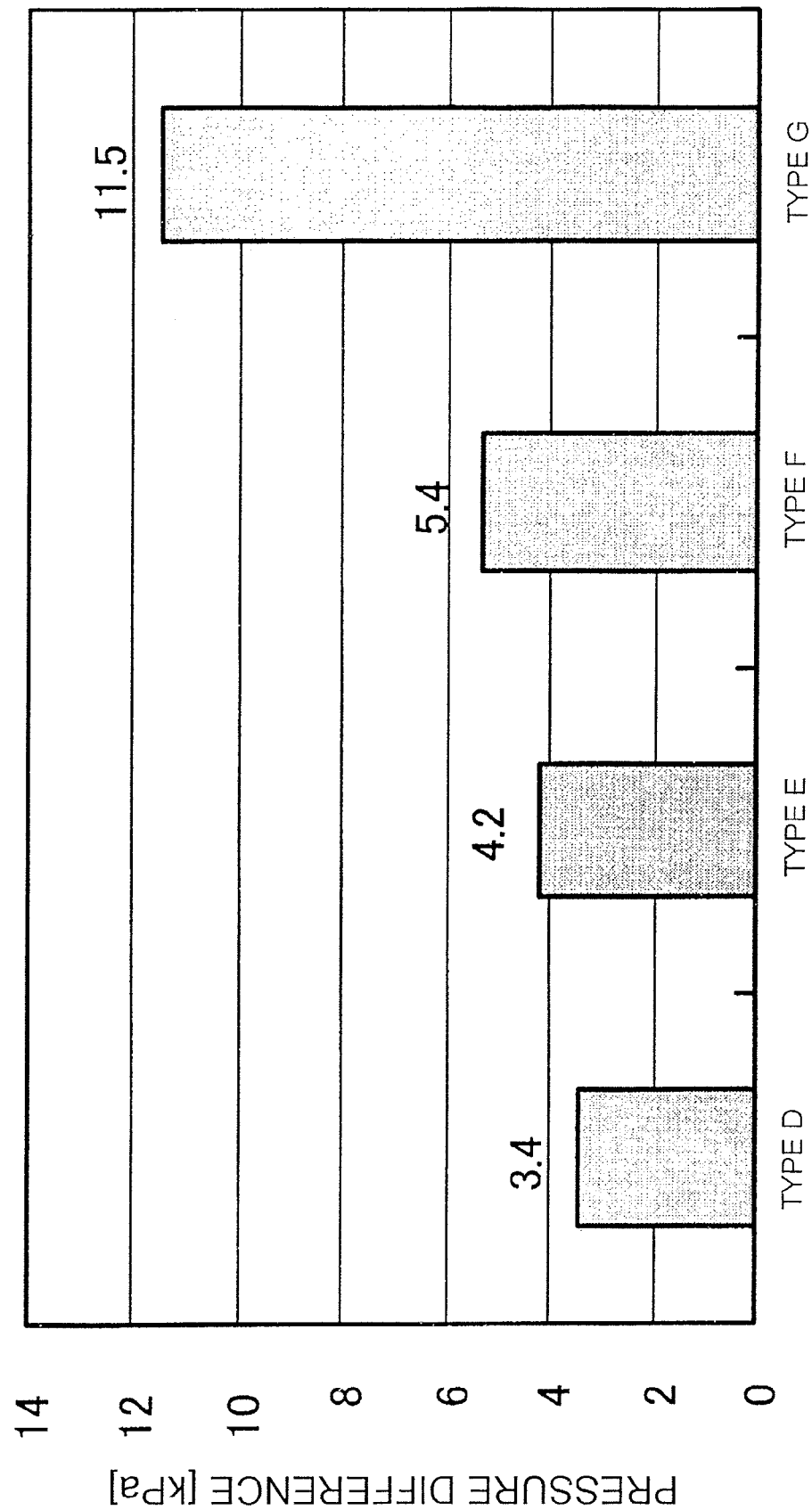
FIG. 13 is a diagram showing a pressure difference between an inlet and an outlet of a coolant in the semiconductor module according to the present invention for each type.

FIG. 13 is a diagram showing a pressure difference between an inlet and an outlet of a coolant in the semiconductor module according to the present invention for each type. In FIG. 13, a variation in pressure loss in the coolant introduction flow channel 21 caused by narrowing down the flow channel width w2 of the flow channel is confirmed. Pressure loss can be measured as a difference in pressure of the coolant between the inlet 24 and the outlet 25.

According to the simulation result shown in FIG. 13, while pressure loss is kept to or below 6 kPa when the flow channel width w2 of the coolant is set to 8 mm or more as is the case of types E and F shown in FIG. 10, pressure loss increases to 11.5 kPa when the flow channel width w2 is narrowed down to 5 mm as is the case of types G, Ga, and Gb. Therefore, it is apparent that when narrowing down the flow channel width w2 at the starting end section of the coolant introduction flow channel 21, pressure loss must be compensated for by using a larger pump to increase coolant flow velocity.

Generally, since there are inverters mounted with a pump with a flow rate of 10 L/min and pump characteristics of 13 kPa or higher, the shape of type G is not an unrealistic flow channel shape. Furthermore, pump performance, coolant (cooling water) temperature, and the flow channel width w2 are desirably optimized in accordance with generation loss at the circuit element units.

In the water jacket 2A according to the present embodiment, the coolant introduction flow channel 21 is defined by an inner surface of the bottom wall 2Ae of the water jacket 2A, an inclined surface of the guide section 21Si, and a front side surface of the fins 2C that constitute the heat sink. In addition, the coolant introduction flow channel 21 is formed such that the cross-sectional area thereof decreases at a constant rate from the side of the inlet 24 toward the trailing end section of the coolant introduction flow channel 21 or the cross-sectional area of the coolant introduction flow channel remains the same until midway through the coolant introduction flow channel 21 and subsequently decreases at a constant rate toward the trailing end section. Therefore, by appropriately adjusting the flow velocity of the coolant that flows into the fins 2C from the coolant introduction flow channel 21 and eliminating a disproportionate flow created in the flow channel of the coolant, a semiconductor device can be cooled in a more uniform and stable manner as compared to conventional configurations and a malfunction or destruction attributable to heat generation by the semiconductor device can be reliably prevented.

From the simulation results described above, with the first embodiment, a flow channel that produces cooling performance capable of responding to different pressure losses at the circuit element units 3D to 3I, 3Iu, and 3Id can be constructed in a cooling apparatus in which the inlet 24 and the outlet 25 are arranged on a same surface of the water jacket. In particular, the shorter the coolant introduction flow channel 21, the more easily disproportionate flow characteristics can be adjusted.

Moreover, the fins 2C that constitute the heat sink are arranged at a position where front side surfaces of the fins 2C are approximately parallel to an inflow direction of the coolant that flows in from the inlet 24 and are flush with an inner wall of the inlet section 21a so as not to block the flow of the coolant in the coolant introduction flow channel 21. In addition, the spacing between the bottom wall 2Ae of the water jacket 2A and the fin base 2B which defines a height of the coolant introduction flow channel 21 is constant.

Second Embodiment

In the second embodiment, a cooler will be described in which the flow channel width of the coolant introduction flow channel 21 is formed narrow as in the first embodiment by providing a separation wall in the coolant introduction flow channel 21 and dividing the flow channel of the coolant into a plurality of flow channels.

Figure 14A:
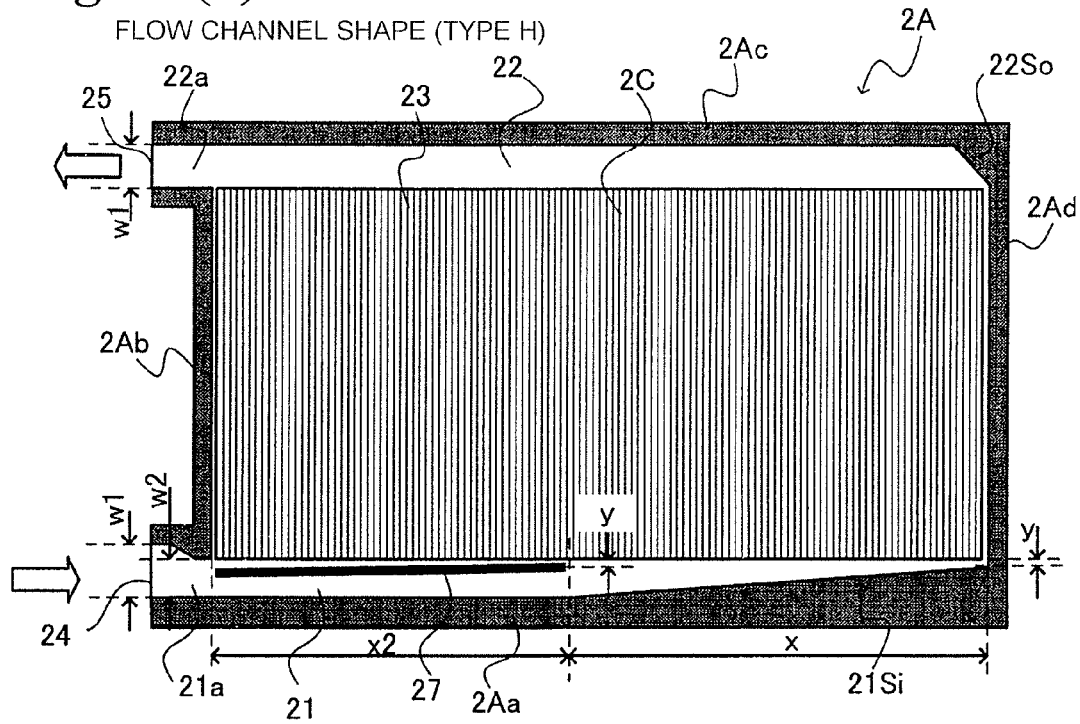
Figure 14B:
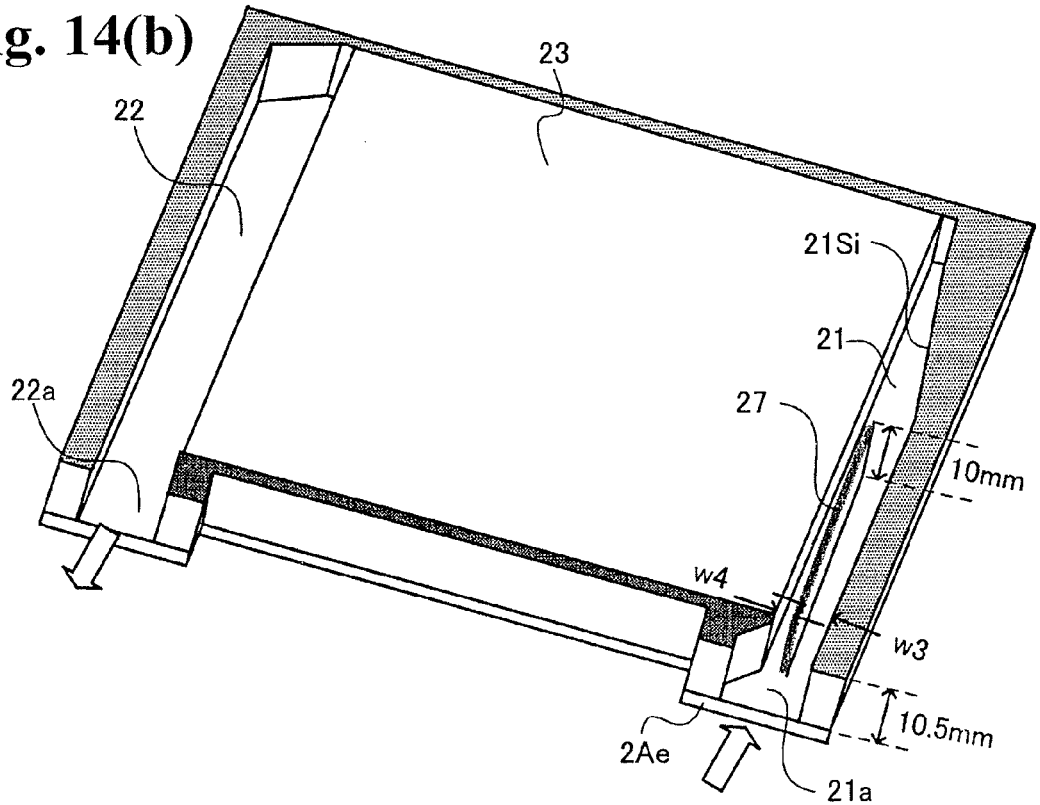

FIGS. 14(A), 14(B) are diagrams showing a water jacket used in the semiconductor module according to the present invention, wherein FIG. 14(A) is a plan view showing a guide section shape of a water jacket and FIG. 14(B) is a perspective view showing the water jacket in FIG. 14(A).

In the type H water jacket 2A shown in FIG. 14(A), the inlet section 21a and the outlet section 22a are respectively set to an equal flow channel width w1 (for example, 15 mm) on the side of the inlet 24 and on the side of the outlet 25. The inlet section 21a which guides the coolant from the inlet 24 to the coolant introduction flow channel 21 and the outlet section 22a for effusing the coolant from the coolant discharge flow channel 22 to the outlet 25 both protrude from the same left sidewall 2Ab in a similar manner to type D, type G, and the like shown in FIGS. 9(A), 9(B). However, the type H water jacket 2A differs from those of type D and type G shown in FIGS. 9(A), 9(B) in that in the inlet section 21a which guides the coolant to the coolant introduction flow channel 21, an inclined surface is only formed on an inner surface on the side of the outlet 25 when the flow channel width w1 at the inlet 24 changes from the flow channel width w2 that is narrowed down at the starting end section of the coolant introduction flow channel 21. In other words, the inlet section 21a has an approximately square cross section, an inclined surface thereof is only formed on the side of the fins 2C, and the inclined surface is inclined so as to guide the coolant introduced from the inlet 24 toward a sidewall (the front sidewall 2Aa) of the coolant introduction flow channel 21.

In addition, while the coolant introduction flow channel is formed from a starting end section thereof to an intermediate position in a downstream direction from the starting end section so as to have a same flow channel width w2 by a flat sidewall surface with a length of x2, the flow channel width is further narrowed down on a downstream side toward a trailing end by the guide section 21Si with a length of x. The guide section 21Si is arranged on an inner surface side of the front sidewall 2Aa facing a front side surface (coolant inflow surface) of the fins 2C in the cooling flow channel 23. Furthermore, the flow channel width of the coolant introduction flow channel 21 is continuously narrowed down by an angle of inclination corresponding to the inclined surface length x of the guide section 21Si to increase coolant flow velocity. Moreover, the inclined surface of the guide section 21Si extends to the right sidewall 2Ad and maintains a distance y from the fins 2C at the trailing end section of the coolant introduction flow channel 21.

In addition, as shown in the perspective view in FIG. 14(B), a separation wall 27 with a height of 10 mm is vertically formed in the coolant introduction flow channel 21 from a surface of the bottom wall 2Ae of the water jacket 2A. The separation wall 27 is arranged with a length of x2 from the starting end section of the coolant introduction flow channel 21 toward a downstream side, and divides the coolant introduction flow channel 21 into two between the starting end section of the coolant introduction flow channel 21 and an approximately midway position where the guide section 21Si is formed. Accordingly, on a side of the starting end section of the coolant introduction flow channel 21, the coolant introduction flow channel 21 is divided into a flow channel with a flow channel width of w3 between the separation wall 27 and the fins 2C and a flow channel with a flow channel width of w4 between the separation wall 27 and the front sidewall 2Aa of the water jacket 2A. The separation wall 27 is arranged at an angle in the coolant introduction flow channel 21 so that the spacing from the fins 2C is equal to the distance y at a downstream-side end section. In this case, with the separation wall 27, a height is set to 10 mm that is slightly lower than a height 10.5 mm of the front sidewall 2Aa of the water jacket 2A, a wall thickness is set to 1.5 mm, the flow channel width w3 is set to 3.5 mm, and the flow channel width w4 is set to 5 mm. Moreover, in this case, the starting end section of the coolant introduction flow channel 21 refers to an entrance region where the inlet section 21a connects to the coolant introduction flow channel 21 and is defined by the front sidewall 2Aa and the left sidewall 2Ab.

FIGS. 15(A), 15(B) are plan views showing a guide section shape of a water jacket of a different type to that in the cooler shown in FIGS. 14(A), 14(B).

The type I water jacket 2A shown in FIG. 15(A) is configured so that a length x2 of the separation wall 27 is longer than that of type H (FIGS. 14(A), 14(B)) or, in other words, equal to or greater than ½ of the length of the coolant introduction flow channel 21, and the inclined surface length x of the guide section 21Si is set short so as to equal or be shorter than half of the length of the coolant introduction flow channel 21. In addition, the separation wall 27 in the coolant introduction flow channel 21 has a length x2 that is approximately equal to a flat inner wall surface in the coolant introduction flow channel 21. Accordingly, since the coolant that flows toward an upstream-side starting end section of the guide section 21Si is divided into two flow channels by the starting end section of the coolant introduction flow channel 21, a flow rate of the coolant that flows into the fins 2C on the side of the trailing end section of the coolant introduction flow channel 21 can be increased.

In the type K water jacket 2A shown in FIG. 15(B), the length of the guide section 21Si is set even shorter than that of type I, and the guide section 21Si connects to an inclined portion with a length of x and has a flat portion with a length of x3 on the side of the trailing end section of the coolant introduction flow channel 21. Type K differs from type H and type I in that the flat portion of the guide section 21Si faces the fins 2C at a distance y and the length x2 of the separation wall 27 formed in the coolant introduction flow channel 21 is formed shorter than a length of a flat surface of the coolant introduction flow channel 21. Moreover, the water jackets 2A shown in FIGS. 15(A), 15(B) are both otherwise the same as that of type H shown in FIGS. 14(A), 14(B).

FIG. 16 is an explanatory diagram showing guide section shapes and flow channel widths of water jackets used in the semiconductor module cooler and the semiconductor module according to the present invention for each type.

The guide section shapes and flow channel widths of water jackets 2A of type J and type L will now be described in addition to type H shown in FIG. 14(A) and type I and type K shown in FIGS. 15(A), 15(B). In the water jacket 2A of type J, the separation wall 27 formed in the coolant introduction flow channel 21 has a length x2 of 215 mm which is longer than that of type I, and a flow channel width from an end position to a trailing end section of the separation wall 27 is narrowed down toward the trailing end by the guide section 21Si. Furthermore, with type L, while the separation wall 27 is formed so as to have the same length x2 as in type K, a length x of the inclined surface of the guide section 21Si is set to 8 mm which is even shorter.

As described earlier, the coolant that flows through the cooling flow channel 23 has a flow velocity distribution that is dependent on the position of the outlet 25. In this case, by forming the separation wall 27 and dividing the coolant introduction flow channel 21 into two flow channels in order to control the flow rate from the coolant introduction flow channel 21 to the cooling flow channel 23, the disproportionate flow characteristics of the coolant can now be adjusted regardless of the position of the outlet 25. In addition, with the water jackets 2A of types H to L, an increase in pressure loss is suppressed by setting a reduction in width (=w1−w2) of the flow channel from the inlet 24 to the coolant introduction flow channel 21 to, for example, within 5 mm. Furthermore, the separation wall 27 in the coolant introduction flow channel 21 partitions the flow channel of the coolant in the water jacket 2A into two and, at the same time, cooperates with the guide section 21Si that is provided so as to narrow down the coolant flow channel on a downstream side of the coolant introduction flow channel 21 in order to form a flow channel that directly flows into the trailing end section of the coolant introduction flow channel 21.

Figure 17A:
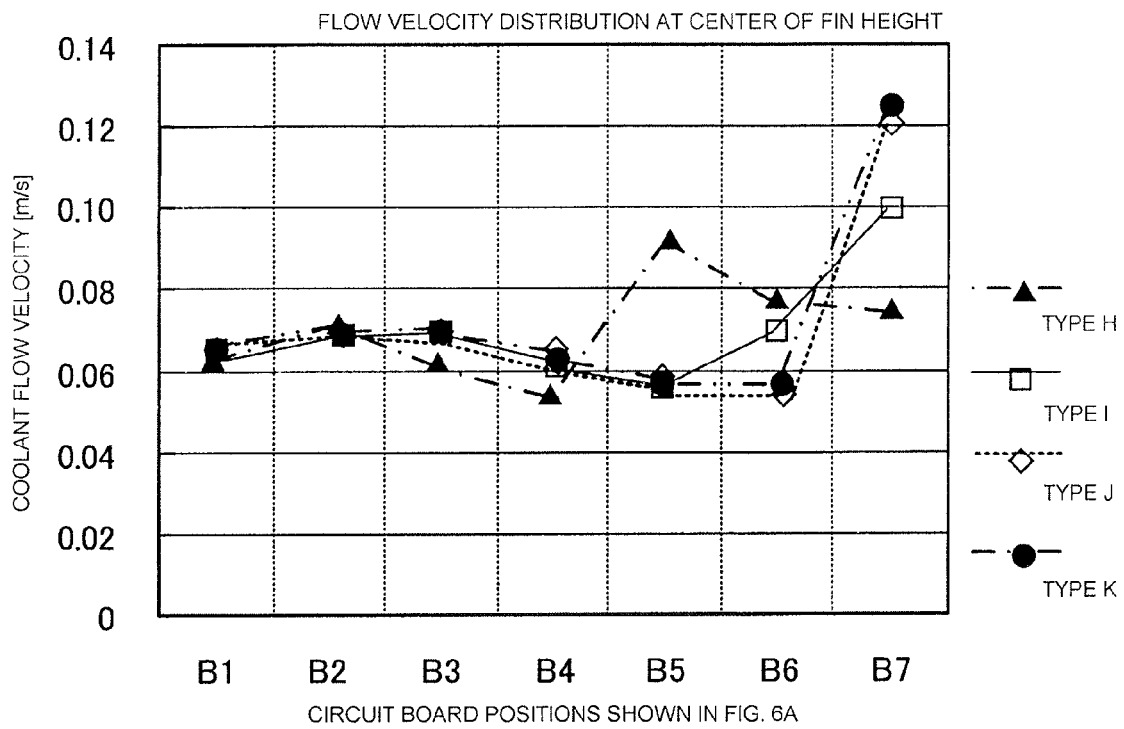
Figure 17B:
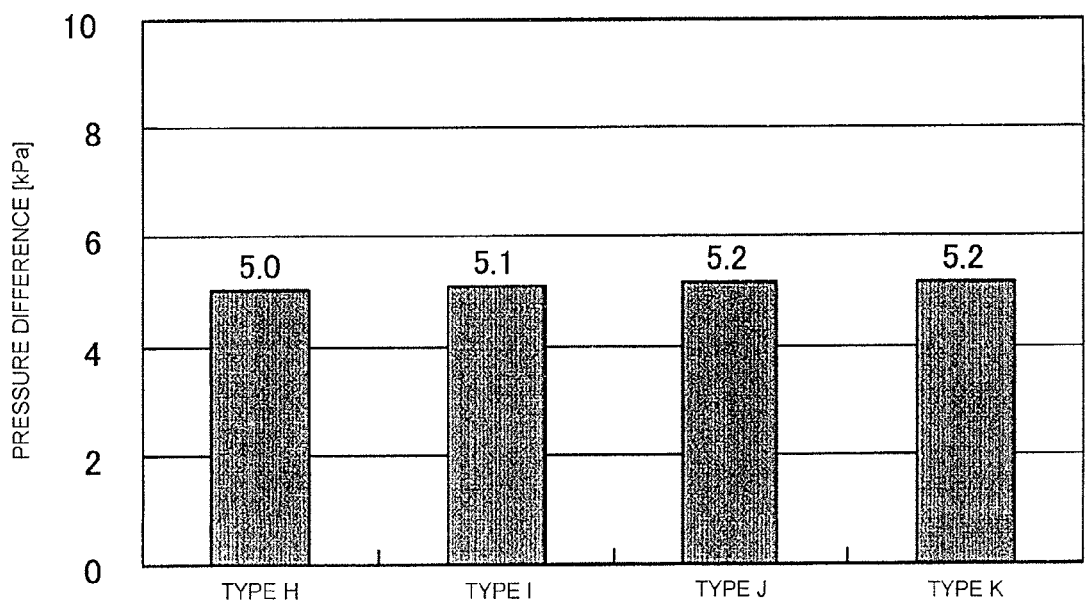

FIGS. 17(A), 17(B) show the respective semiconductor module coolers shown in FIG. 16, wherein FIG. 17(A) is a diagram showing a flow velocity distribution of a coolant for each position on a circuit board and FIG. 17(B) is a diagram showing a pressure difference between an inlet and an outlet of the coolant.

Positions shown in FIG. 6(A) were used as positions for comparison. Positions related to flow velocity were compared with the positions B1 to B7. Pressure loss was assumed to be a pressure difference between the inlet and the outlet. Junction temperatures were compared for three locations, namely, IGBT devices respectively arranged on the downstream side of the circuit element units 3D and 3G in the first column (B1) and the fourth column (B4), and the circuit element unit 3Id in the seventh column with a large generation loss.

In the semiconductor module cooler of type H, the separation wall 27 is arranged to a central portion of the coolant introduction flow channel 21 in a longitudinal direction thereof. The simulation results for type H presented in FIG. 17(A) show that flow velocities at the positions B5 and B6 are higher than the flow velocity at the position B7. This indicates that flow velocity can be appropriately adjusted by providing the separation wall 27 and adjusting the length x2 of the separation wall 27. In other words, when desiring to particularly improve only the cooling efficiency at the position B5, the length x2 of the separation wall 27 need only be extended to just before the position B5 as in the case of the water jacket 2A of type H.

Next, in the semiconductor module cooler of type I, the separation wall 27 is formed so that the length x2 thereof is longer than that in type H. Therefore, according to the simulation result for type I shown in FIG. 17(A), the flow velocity at the position B7 is 0.10 m/s which is higher compared to that for type H. Furthermore, with type J and type K in which the length x2 of the separation wall 27 is longer, the flow velocity at the position B6 is 0.07 m/s which is higher, and the flow velocity at the position B7 is higher in types J and K by about 0.02 m/s. As shown, in order to improve the cooling efficiency at the circuit element unit 3Id which is arranged at the position B7 that is separated from the outlet 25 and which has a high generation loss, the length x2 of the separation wall 27 is desirably increased, and in order to particularly improve the cooling efficiency at the position B5 which is close to the outlet 25, the separation wall 27 is desirably extended to the vicinity of the position B5. In other words, by extending the separation wall 27 from the starting end section to a particular position in the coolant introduction flow channel 21, the flow velocity distribution of the coolant can be controlled and performance of the cooler can be improved by adjusting the flow velocity at the particular position.

In addition, a comparison of flow velocities at the position B7 between semiconductor modules of type J and type K which have different shapes of the guide section 21Si results in flow velocities of 0.121 m/s for type J and 0.125 m/s for type K, which shows that pressure loss is slightly smaller with type K. Therefore, in order to improve the cooling performance of the circuit element unit 3Id, desirably, the shape of the guide section 21Si is inclined relative to the heat sink in a range of the length x and brought parallel to the heat sink in a range of the length x3 of the trailing end section as with type K shown in FIG. 15(B) in order to reduce the cross-sectional area of the coolant introduction flow channel 21, and causing the coolant to flow to the circuit element unit 3Id at an increased flow velocity at the trailing end section of the coolant introduction flow channel 21. Such a shape of the guide section 21Si is capable of suppressing a decrease in flow velocity at the position B7 and is therefore particularly effective when, during the manufacture of the cooler, a gap is created between the heat sink and the right sidewall 2Ad of the water jacket 2A and the gap is inevitably larger than the intervals between the fins 2C.

With the separation wall 27, since the longer the length x2 thereof, the higher the flow velocity at the position B7, the flow velocity distribution in the cooling flow channel 23 can be improved to realize disproportionate flow characteristics that is not dependent on the outlet 25. In addition by increasing the flow rate of the coolant flowing to the trailing end section of the coolant introduction flow channel 21, a disproportionate flow in the cooling flow channel 23 can be remedied. In other words, aside from the separation wall 27 which improves the flow velocity distribution in the cooler 2, by arranging the guide section 21Si having an inclined portion and a flat portion such as that in type K, flow velocity which increases in a focused manner at the trailing end section of the coolant introduction flow channel 21 can be relaxed. Therefore, even in cases where the circuit element unit 3Id with a particularly high generation loss is arranged or where circuit element units 3D to 3I, 3Id, and 3Iu with different generation losses are arranged as the semiconductor module 10A shown in FIG. 6(A), the cooling performance of the cooler 2 can be improved.

Furthermore, according to the pressure loss shown in FIG. 17(B), a pressure difference of the coolant between the inlet 24 and the outlet 25 is equal to or lower than 6 kPa in any type. Therefore, even if the flow channel width w2 at the starting end section of the coolant introduction flow channel 21 is not narrowed down to the flow channel width in the cooler according to the first embodiment, by dividing the coolant introduction flow channel 21 into two flow channels, a flow channel shape that enables low pressure loss and flow velocity adjustment can be realized.

The above demonstrates that, with a cooling apparatus in which the inlet 24 and the outlet 25 are arranged on the side of a same surface, by narrowing down the flow channel width w2 of the coolant introduction flow channel 21 to a certain degree with respect to the flow channel width w1 of the coolant discharge flow channel 22 and constructing the separation wall 27 so that the coolant is divided into two when flowing through the coolant introduction flow channel 21, a disproportionate flow distribution can be adjusted and a semiconductor module cooler with a higher cooling efficiency can be obtained.

According to such simulation results, for flow channels having the guide section shapes and the flow channel widths of the water jackets of the different types shown in FIG. 16, respectively, a heat generation state of a power semiconductor device can be confirmed based on generation loss at the circuit element units 3D to 3I, 3Iu, and 3Id.

Figure 18A:
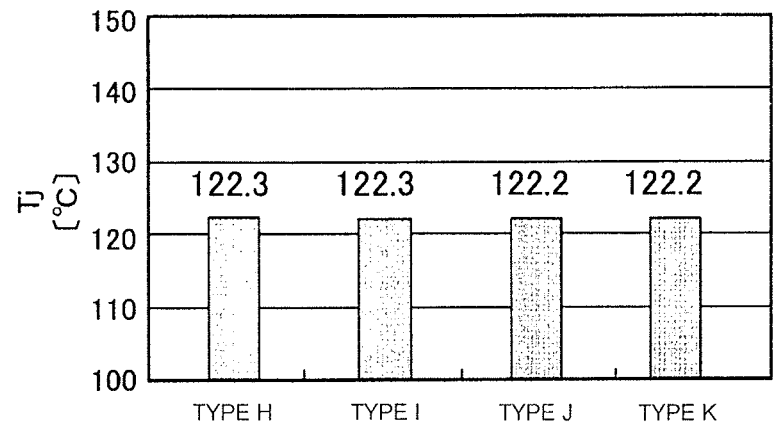
FIGS. 18(A)-18(C) are diagrams showing a heating temperature in a steady state of the water jackets shown in FIG. 16 for each type.
Figure 18B:
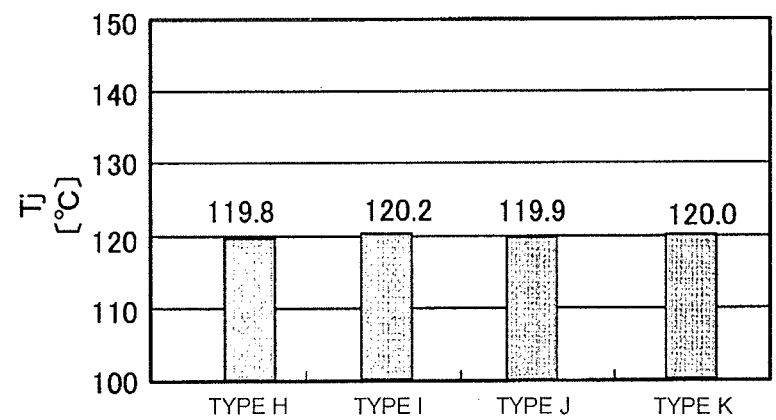
Figure 18C:
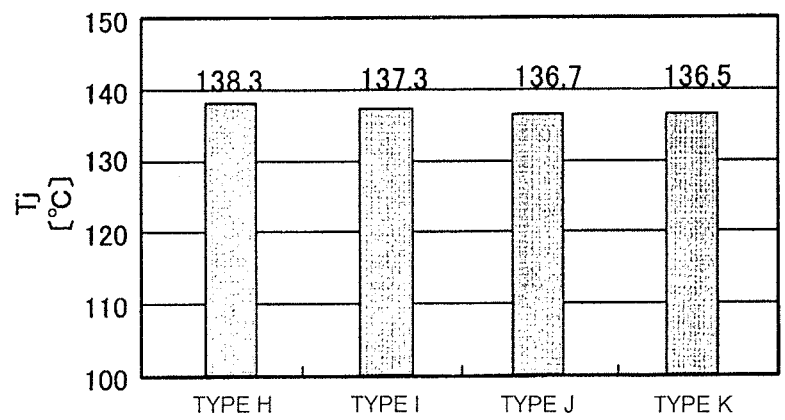

FIGS. 18(A)-18(C) are diagrams showing a heating temperature in a steady state of the water jackets shown in FIG. 16 for each type. IGBT devices respectively arranged on downstream sides of the first-column (B1) circuit element unit 3D and the fourth-column (B4) circuit element unit 3G of the semiconductor module shown in FIG. 6(A) are set as targets for comparison for heating temperatures in FIGS. 18(A), 18(B). Furthermore, in FIG. 18(C), an IGBT device on an upstream side of whichever circuit element unit has greater generation loss among the circuit element units 3Iu and 3Id of the seventh column (B7) is set as the target for comparison.

A comparison of junction temperatures Tj for every type of the circuit element unit 3Id with high generation loss shown in FIG. 18(C) shows that the junction temperature Tj is 138.3° C. for type H, 137.3° C. for type I, 136.7° C. for type J, and 136.5° C. for type K. In other words, there is an apparent correlation between the results of improvements of flow velocity distribution shown in FIG. 17(A) and the results of junction temperatures shown in FIGS. 18(A)-18(C), and it is found that necessary flow velocities are realized in response to generation losses at the positions B1, B4, and B7 in every one of the types H to L. Therefore, a flow velocity distribution that is dependent on the position of the outlet 25 is remedied and cooling performances at the respective circuit element units 3D to 3I, 3Iu, and 3Id arranged on the water jacket 2A can be enhanced.

In addition, such simulation results show that a guide section 21Si having the following shape is favorably used when adjusting a coolant flow velocity distribution. First, as in types J and K, the guide section 21Si is arranged so that a changing point of angles of inclination (in other words, a corner section between a flat surface and an inclined surface) is positioned within ¼ or less from the side of the trailing end section in a longitudinal direction of the coolant introduction flow channel 21 facing the fins 2C from the inlet 24. In addition, the intervals between the fins 2C and the guide section 21Si at the trailing end section of the coolant introduction flow channel 21 is set to 1 mm or more and ⅓ or less of a maximum flow channel width of the coolant introduction flow channel 21.

Third Embodiment

Next, a water jacket 2A provided with the separation wall that is not inclined will be described as the third embodiment.

In the second embodiment, since the guide section 21Si provided on the side of the inner surface of the front sidewall 2Aa facing the fins 2C of the water jacket 2A has a predetermined angle of inclination, the separation wall 27 which divides the flow channel of the coolant is also provided with an angle of inclination toward the side of the fins 2C in a downstream direction. However, from the perspective of ease of water jacket manufacturing technology, desirably, the separation wall 27 is arranged parallel to the front sidewall 2Aa and improves cooling performance at the trailing end position B7 of the coolant introduction flow channel 21.

FIGS. 19(A), 19(B) are diagrams showing a water jacket used in the semiconductor module according to the present invention, wherein FIG. 19(A) is a plan view showing a guide section shape of a water jacket and FIG. 19(B) is a partial perspective view showing the water jacket in FIG. 19(A).

The type M water jacket 2A shown in FIG. 19(A) shares the same shape as type K shown in FIG. 15(B), in which the guide section 21Si having an inclined portion with a length x (13 mm) and a flat portion with a length x3 (5 mm) is arranged in a trailing end section of the coolant introduction flow channel 21. However, the type M water jacket 2A differs from the water jackets 2A of type I and type K shown in FIGS. 15(A), 15(B) in that the separation wall 27 formed so as to divide the coolant introduction flow channel 21 into two flow channels is arranged parallel to a side surface on a coolant inflow side of the fins 2C in the cooling flow channel 23.

The separation wall 27 arranged in the coolant introduction flow channel 21 in type M has a total length of 215 mm in the coolant introduction flow channel 21, and is provided so as to divide a flow channel formed with a width of mm into two flow channels including a fin 2C-side flow channel with a width of 3.5 mm and a front sidewall 2Aa side flow channel with a width of 5 mm. In addition, at the trailing end section on a downstream side of the separation wall 27, a tip section 27a is formed which bends at an approximately 45° C. angle to a position where the spacing from the fins 2C becomes 2 mm while maintaining a thickness (1.5 mm) of the separation wall 27 itself. Moreover, the starting end section on the upstream side of the separation wall 27 is positioned in an entrance region of the coolant introduction flow channel 21.

By forming the tip section 27a of the separation wall 27 in this manner, in addition to increasing a flow velocity of the coolant that flows in from the inlet 24, the flow rate of the coolant which flows into the fins 2C facing the tip section 27a can be increased. Therefore, the flow velocity of the coolant which proceeds toward the trailing end section in the coolant introduction flow channel 21 increases and, at the same time, a cooling effect on a circuit element unit arranged at a position of the tip section 27a of the separation wall 27 can be enhanced.

In other words, by increasing the flow velocity of the coolant which proceeds toward the trailing end section in the coolant introduction flow channel 21, the cooling performance of the cooler 2 can be appropriately improved in response to generation losses at the circuit element units 3D to 3I, 3Iu, and 3Id arranged on the semiconductor module 10A shown in FIG. 6A.

Figure 20:
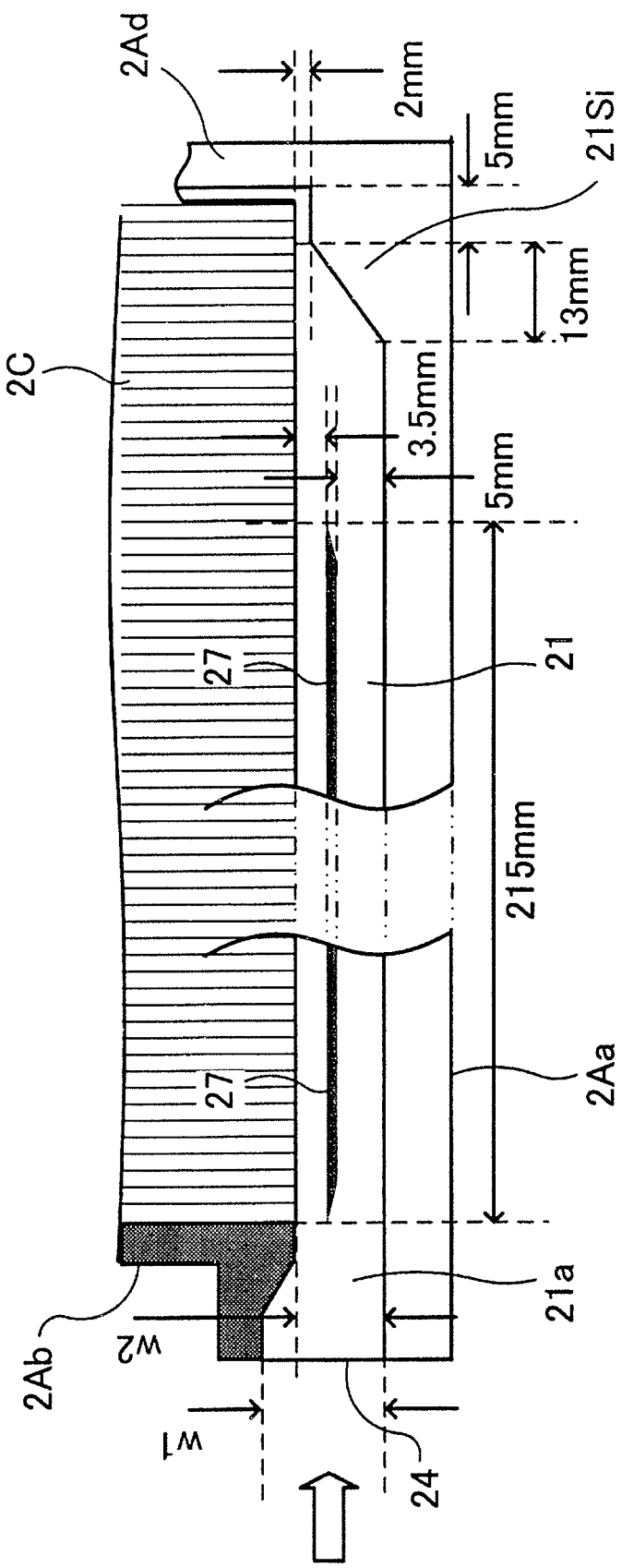
FIG. 20 is a partial plan view showing an introduction channel shape of a water jacket of a type N that differs from that in the cooler shown in FIGS. 19(A), 19(B).

FIG. 20 is a partial plan view showing an introduction channel shape of a water jacket of type N that differs from that in the cooler shown in FIG. 19.

In a semiconductor module cooler comprising the type N water jacket shown in FIG. 20, a single plate-like separation wall 27 is arranged so as to divide the coolant introduction flow channel 21 into two flow channels from the starting end section thereof. In a similar manner to type M shown in FIGS. 19(A), 19(B), the separation wall 27 is arranged parallel to the front sidewall 2Aa of the water jacket 2A. In addition, the separation wall 27 is configured shorter on the side of the front sidewall 2Aa of the water jacket 2A than on the side of the fins 2C and has an approximately trapezoidal cross-sectional shape in plan view. This configuration is adopted in order to prevent unnecessary vortices from being created and ensure a smooth flow of the coolant that flows into the coolant introduction flow channel 21.

As described above, desirably, the separation wall 27 adopts a shape which is based on the separation wall 27 with a square cross-sectional shape shown in FIGS. 19(A), 19(B). In addition, by chamfering corners and the like, the separation wall 27 is prevented from acting as unnecessary resistance to the flow of the current.

Figure 21A:
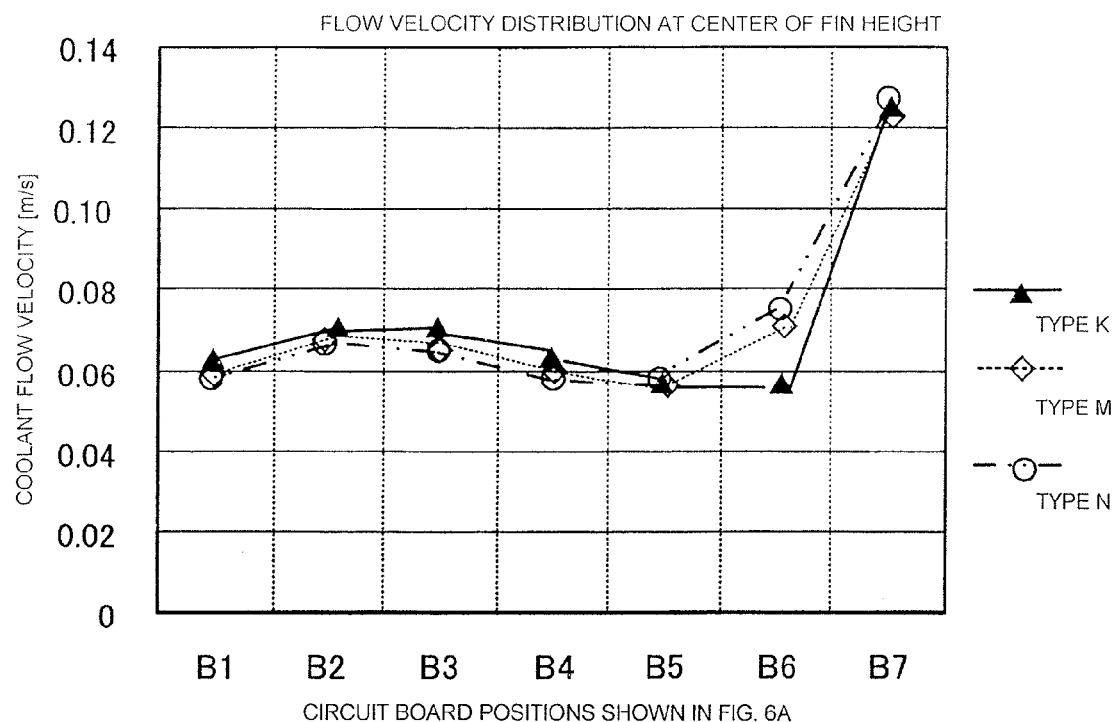
Figure 21B:
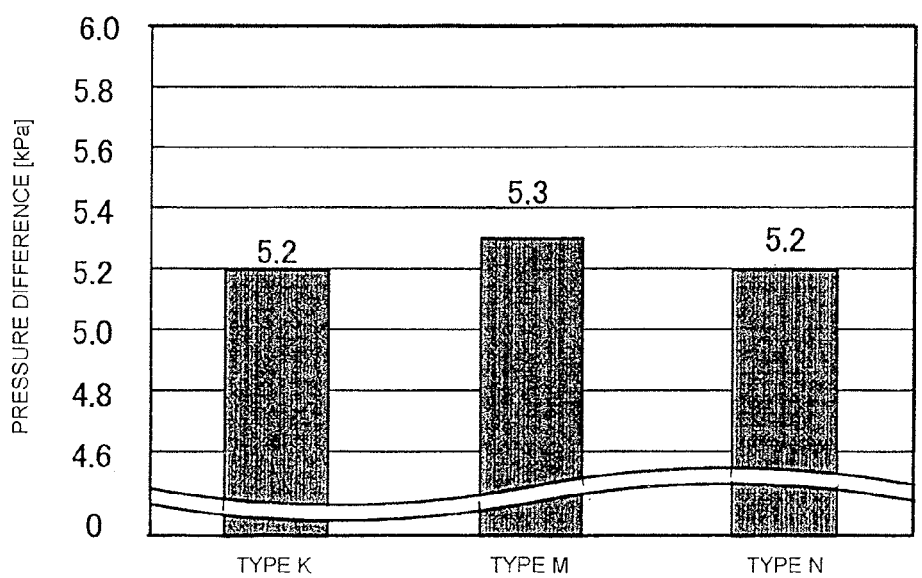

FIGS. 21(A), 21(B) show the respective semiconductor module coolers shown in FIGS. 15(B), 19(A), and 20, wherein FIG. 21(A) is a diagram showing a flow velocity distribution of a coolant for each position on a circuit board and FIG. 21(B) is a diagram showing a pressure difference between an inlet and an outlet of the coolant.

FIG. 21(A) shows flow velocity distributions of the coolant using the circuit board positions B1 to B7 shown in FIG. 6(A) as locations for comparison. The flow velocity at the position B7 is 0.123 m/s for type M and 0.127 m/s for type N. In other words, the flow velocity distributions of type M and type N show that the flow velocity at the circuit board position B6 can be set higher than that in type K without reducing the flow velocity at the final position B7.

In addition, as shown in FIG. 21(B), the pressure difference between the inlet 24 and the outlet 25 is kept to a low pressure loss equal to or lower than 6 kPa in either type. Therefore, since load which inhibits pump performance can be reduced and a coolant flow rate can be readily increased, cooling performance can be further enhanced.

The simulation results shown in FIGS. 21(A), 21(B) demonstrate that by arranging, in the coolant introduction flow channel 21, a separation wall which is formed so as to extend from a starting end section of the coolant introduction flow channel 21 toward a downstream direction of the coolant and which is parallel to and separated from one side surface of the fins 2C, disproportionate flow characteristics where flow velocity on a side of the position of the outlet 25 among the flow velocity distribution in the cooling flow channel 23 can be further remedied and the flow velocity which the coolant flows between fins directly under a central portion of the circuit element unit 3Id with high generation loss can be locally increased. In other words, compared to types H to L in which the separation wall 27 is arranged inclined, by arranging the separation wall 27 so as to be parallel to the fins 2C, in addition to achieving ease of manufacturing technology, the flow velocity of the coolant at the positions B1 to B4 on the side of the outlet 25 can be suppressed and the flow velocity at the position B6 can be increased.

When generation loss at the circuit element units 3Id and 3Iu is high, the flow velocity at the position B6 is desirably increased in consideration of spread of heat in the water jacket 2A. At the same time, a flow velocity of 0.05 m/s or higher can be approximately uniformly maintained at the other positions B1 to B5. Therefore, the respective semiconductor devices in the semiconductor module can be cooled in an uniform and stable manner and cooling efficiency can be improved.

Next, a heat generation state of a power semiconductor device was confirmed by simulation by subjecting the circuit element units 3D to 3I, 3Iu, and 3Id to corresponding generation loss. IGBT devices respectively arranged on the downstream side of the circuit element units 3D and 3G in the first column (B1) and the fourth column (B4), and the IGBT device arranged at the circuit element unit 3Id with greater generation loss among the circuit element units 3Iu and 3Id in the seventh column (B7) were similarly used as targets for evaluation.

FIGS. 22(A)-22(C) are diagrams showing performances of the water jackets shown in FIGS. 15(B), 19(A), and 20 for each type.

With the cooling flow channel 23 below the circuit element units 3D to 3I in the semiconductor module coolers of types K, M, and N, since a stable flow velocity can be obtained from a relationship related to pressure loss thereof, the junction temperature of semiconductor devices arranged in the circuit element units 3D to 3I has a lower value than the junction temperature at the circuit element units 3Id and 3Iu. On the other hand, the junction temperature at the position 3Id shown in FIG. 22(C) is 136.5° C. for type K, 135.9° C. for type M, and 135.8° C. for type N. In other words, the junction temperature is lower for types M and N than type K and is improved by arranging the separation wall 27 parallel to the sidewall of the fins 2C. This effect is not dependent on the presence or absence of the tip section 27a which is provided at the trailing end section of the separation wall 27 in type M and which is inclined by 45 degrees.

As described above, by simply arranging the separation wall 27 to be parallel to the fins 2C and giving the separation wall 27 a trapezoidal shape or a chamfered and approximately cuboid shape without bending the tip section 27a, flow velocity distribution can be adjusted and overall cooling performance can be improved.

Moreover, the present invention is not limited to the embodiments described above and various modifications can be made without departing from the spirit and scope of the invention.

The description above simply presents principles of the present invention. A wide variety of modifications and changes may be made by those skilled in the art. The present invention is not limited to the accurate configurations and applications presented and described above, and all corresponding modifications and equivalents are deemed to be within the scope of the following claims and equivalents thereof.

EXPLANATION OF REFERENCE NUMERALS 2 cooler
2A water jacket
2B fin base
2C fin
10, 10A semiconductor module
21 coolant introduction flow channel
21a inlet section
21Si, 22So guide section
22 coolant discharge flow channel
22a outlet section
23 cooling flow channel
24 inlet
25 outlet
26 base material
27 separation wall
27a tip section
3A to 3I, 3Iu, 3Id circuit element unit
31 substrate
31a insulated substrate
31b, 31c conductive pattern
32, 33 semiconductor device
34, 35 joining layer
40 inverter circuit
41 three-phase AC motor
C clearance
B1 to B7 position

What is claimed is:

1. A semiconductor module cooler for supplying a coolant to a water jacket from outside and cooling a semiconductor device arranged on an outer surface of the cooler, the semiconductor module cooler comprising:
   a heat sink thermally connected to the semiconductor device;
   a first flow channel arranged inside the water jacket with a guide section extending from a coolant inlet and having an inclined surface for guiding the coolant toward one side surface of the heat sink;
   a second flow channel arranged inside the water jacket in parallel to the first flow channel and extending to a coolant outlet, the second flow channel being formed with a sidewall in parallel to another side surface of the heat sink; and
   a third flow channel formed inside the water jacket at a position connecting the first flow channel and the second flow channel,
   wherein the coolant inlet and the coolant outlet are formed on a same wall surface of the water jacket, and the heat sink is arranged in the third flow channel,
   a cross-sectional area of the first flow channel at an end section on a coolant inlet side is smaller than a cross-sectional area of the second flow channel at an end section on a coolant outlet side, and
   the guide section is configured to reduce the cross-sectional area of the first flow channel from the coolant inlet to one side surface of the heat sink contacting the guide section.

2. The semiconductor module cooler according to claim 1, wherein a separation wall separate from the one side surface of the heat sink and formed to extend from a starting end section of the first flow channel in a downstream direction of the coolant is arranged in the first flow channel.

3. A semiconductor module cooler for supplying a coolant to a water jacket from outside and cooling a semiconductor device arranged on an outer surface of the cooler, the semiconductor module cooler comprising:
   a heat sink thermally connected to the semiconductor device;
   a first flow channel arranged inside the water jacket with a guide section extending from a coolant inlet and having an inclined surface for guiding the coolant toward one side surface of the heat sink;
   a second flow channel arranged inside the water jacket in parallel to the first flow channel and extending to a coolant outlet, the second flow channel being formed with a sidewall in parallel to another side surface of the heat sink; and
   a third flow channel formed inside the water jacket at a position connecting the first flow channel and the second flow channel,
   wherein the coolant inlet and the coolant outlet are formed on a same wall surface of the water jacket, and the heat sink is arranged in the third flow channel,
   a plurality of semiconductor devices with different heat generation characteristics is arranged on the outer surface of the semiconductor module cooler,
   the semiconductor devices having highest heat generation characteristics are arranged at a trail end section side of the first flow channel away from the coolant outlet,
   the first flow channel is configured so that a flow channel width of the first flow channel on a coolant inlet side is equal to a width of the second flow channel, and
   a cross-sectional area of the first flow channel continuously decreases on a downstream side in the first flow channel.

4. A semiconductor module cooler for supplying a coolant to a water jacket from outside and cooling a semiconductor device arranged on an outer surface of the cooler, the semiconductor module cooler comprising:
   a heat sink thermally connected to the semiconductor device;
   a first flow channel arranged inside the water jacket with a guide section extending from a coolant inlet and having an inclined surface for guiding the coolant toward one side surface of the heat sink;
   a second flow channel arranged inside the water jacket in parallel to the first flow channel and extending to a coolant outlet, the second flow channel being formed with a sidewall in parallel to another side surface of the heat sink;
   a third flow channel formed inside the water jacket at a position connecting the first flow channel and the second flow channel;
   an inlet section for guiding the coolant from the coolant inlet to the first flow channel; and
   an outlet section for effusing the coolant from the second flow channel to the coolant outlet,
   wherein the coolant inlet and the coolant outlet are formed on a same wall surface of the water jacket, and the heat sink is arranged in the third flow channel, and
   a wall of the inlet section on a heat sink side has an inclined surface for guiding the coolant toward a sidewall of the first flow channel.

5. A semiconductor module cooler for supplying a coolant to a water jacket from outside and cooling a semiconductor device arranged on an outer surface of the cooler, the semiconductor module cooler comprising:
   a heat sink thermally connected to the semiconductor device;
   a first flow channel arranged inside the water jacket with a guide section extending from a coolant inlet and having an inclined surface for guiding the coolant toward one side surface of the heat sink;
   a second flow channel arranged inside the water jacket in parallel to the first flow channel and extending to a coolant outlet, the second flow channel being formed with a sidewall in parallel to another side surface of the heat sink; and
   a third flow channel formed inside the water jacket at a position connecting the first flow channel and the second flow channel,
   wherein the coolant inlet and the coolant outlet are formed on a same wall surface of the water jacket, and the heat sink is arranged in the third flow channel,
   a separation wall separate from the one side surface of the heat sink and formed to extend from a starting end section of the first flow channel in a downstream direction of the coolant is arranged in the first flow channel, and
   the separation wall has a length equal to or greater than ½ of a length of the first flow channel, and has an inclined surface inclined at an angle different from an angle of inclination of the guide section for guiding the coolant toward the one side surface of the heat sink.

6. A semiconductor module cooler for supplying a coolant to a water jacket from outside and cooling a semiconductor device arranged on an outer surface of the cooler, the semiconductor module cooler comprising:
   a heat sink thermally connected to the semiconductor device;
   a first flow channel arranged inside the water jacket with a guide section extending from a coolant inlet and having an inclined surface for guiding the coolant toward one side surface of the heat sink;

a second flow channel arranged inside the water jacket in parallel to the first flow channel and extending to a coolant outlet, the second flow channel being formed with a sidewall in parallel to another side surface of the heat sink; and a third flow channel formed inside the water jacket at a position connecting the first flow channel and the second flow channel, wherein the coolant inlet and the coolant outlet are formed on a same wall surface of the water jacket, and the heat sink is arranged in the third flow channel, a separation wall separate from the one side surface of the heat sink and formed to extend from a starting end section of the first flow channel in a downstream direction of the coolant is arranged in the first flow channel, and the separation wall has a length equal to or greater than ½ of a length of the first flow channel, and is arranged parallel to the one side surface of the heat sink.

7. A semiconductor module cooler for supplying a coolant to a water jacket from outside and cooling a semiconductor device arranged on an outer surface of the cooler, the semiconductor module cooler comprising:

a heat sink thermally connected to the semiconductor device;

a first flow channel arranged inside the water jacket with a guide section extending from a coolant inlet and having an inclined surface for guiding the coolant toward one side surface of the heat sink;

a second flow channel arranged inside the water jacket in parallel to the first flow channel and extending to a coolant outlet, the second flow channel being formed with a sidewall in parallel to another side surface of the heat sink; and a third flow channel formed inside the water jacket at a position connecting the first flow channel and the second flow channel, wherein the coolant inlet and the coolant outlet are formed on a same wall surface of the water jacket, and the heat sink is arranged in the third flow channel, a separation wall separate from the one side surface of the heat sink and formed to extend from a starting end section of the first flow channel in a downstream direction of the coolant is arranged in the first flow channel, and the separation wall is arranged to reach a height equal to or greater than 50% of a height of the flow channel from a bottom surface of the water jacket.

8. The semiconductor module cooler according to claim 2, wherein the guide section includes one surface inclined toward the one side surface of the heat sink and another surface continuous with the one side surface of the heat sink.

9. The semiconductor module cooler according to claim 8, wherein the another surface of the guide section is parallel to the one side surface of the heat sink.

10. A semiconductor module cooler for supplying a coolant to a water jacket from outside and cooling a semiconductor device arranged on an outer surface of the cooler, the semiconductor module cooler comprising:

a heat sink thermally connected to the semiconductor device;

a first flow channel arranged inside the water jacket with a guide section extending from a coolant inlet and having an inclined surface for guiding the coolant toward one side surface of the heat sink;

a second flow channel arranged inside the water jacket in parallel to the first flow channel and extending to a coolant outlet, the second flow channel being formed with a sidewall in parallel to another side surface of the heat sink; and a third flow channel formed inside the water jacket at a position connecting the first flow channel and the second flow channel, wherein the coolant inlet and the coolant outlet are formed on a same wall surface of the water jacket, and the heat sink is arranged in the third flow channel, a separation wall separate from the one side surface of the heat sink and formed to extend from a starting end section of the first flow channel in a downstream direction of the coolant is arranged in the first flow channel, the guide section includes one surface inclined toward the one side surface of the heat sink and another surface continuous with the one side surface of the heat sink, the another surface of the guide section is formed on a side of a trailing end section of the first flow channel with a length equal to or less than ¼ of a flow channel length from the coolant inlet to the trailing end section, and the another surface of the guide section and the one side surface of the heat sink are separated from each other by ⅓ or less of a maximum flow channel width of the first flow channel.

11. A semiconductor module cooler for supplying a coolant to a water jacket from outside and cooling a semiconductor device arranged on an outer surface of the cooler, the semiconductor module cooler comprising:

a heat sink thermally connected to the semiconductor device, a first flow channel arranged inside the water jacket with a guide section extending from a coolant inlet and having an inclined surface for guiding the coolant toward one side surface of the heat sink;

a second flow channel arranged inside the water jacket in parallel to the first flow channel and extending to a coolant outlet, the second flow channel being formed with a sidewall in parallel to another side surface of the heat sink; and a third flow channel formed inside the water jacket at a position connecting the first flow channel and the second flow channel, wherein the coolant inlet and the coolant outlet are formed on a same wall surface of the water jacket, and the heat sink is arranged in the third flow channel, a plurality of semiconductor devices with different heat generation characteristics is arranged on the outer surface of the semiconductor module cooler along an introduction direction of the coolant, and a separation wall is arranged in the first flow channel from the coolant inlet in a downstream direction to a region where the semiconductor devices having highest heat generation characteristics is arranged.

12. The semiconductor module cooler according to claim 1, wherein the heat sink has a cuboid external shape.

13. The semiconductor module cooler according to claim 1, wherein the heat sink is arranged to be spaced from a bottom surface of the third flow channel.

14. The semiconductor module cooler according to claim 1, wherein the water jacket is sealed with a fin base having the heat sink, excluding the coolant inlet and the coolant outlet.

15. The semiconductor module cooler according to claim 1 wherein a wall surface of the water jacket formed with the coolant inlet and the coolant outlet is a sidewall having an inner surface in parallel to fins of the heat sink.

* * * * *

UNITED STATES PATENT AND TRADEMARK OFFICE
CERTIFICATE OF CORRECTION

PATENT NO. : 9,237,676 B2
APPLICATION NO. : 14/110856
DATED : January 12, 2016
INVENTOR(S) : Hiromichi Gohara et al.

It is certified that error appears in the above-identified patent and that said Letters Patent is hereby corrected as shown below:

In the specification

Please change column 9, line 8, from "… flow channel is …" to --… flow channel 23 is …--.

Please change column 9, line 31, from "… the outlet are" to --… the outlet 25 are--.

Please change column 16, line 51, from "… flow channel" to --… flow channel 21--.

Please change column 17, line 53, from "… flow channel is" to --… flow channel 21 is--.

Please change column 21, line 64, from "… separation wall" to --… separation wall 27--.

Please change column 22, line 29, from "… width of mm …" to --… width of 10 mm …--.

Signed and Sealed this
Tenth Day of May, 2016

Michelle K. Lee
*Director of the United States Patent and Trademark Office*